United States Patent
Mori et al.

(10) Patent No.: US 11,172,599 B2
(45) Date of Patent: Nov. 9, 2021

(54) ELECTROMAGNETIC-WAVE SHIELDING SHEET AND ELECTRONIC COMPONENT-MOUNTED SUBSTRATE

(71) Applicants: TOYO INK SC HOLDINGS CO., LTD., Tokyo (JP); TOYOCHEM CO., LTD., Tokyo (JP)

(72) Inventors: Shota Mori, Chuo-ku (JP); Kazunori Matsudo, Chuo-ku (JP); Kenji Ando, Chuo-ku (JP); Tsutomu Hayasaka, Chuo-ku (JP)

(73) Assignees: TOYO INK SC HOLDINGS CO., LTD., Tokyo (JP); TOYOCHEM CO., LTD., Tokyo (JP)

( * ) Notice: Subject to any disclaimer, the term of this patent is extended or adjusted under 35 U.S.C. 154(b) by 0 days.

(21) Appl. No.: 17/267,919

(22) PCT Filed: Oct. 1, 2019

(86) PCT No.: PCT/JP2019/038726
§ 371 (c)(1),
(2) Date: Feb. 11, 2021

(87) PCT Pub. No.: WO2020/071356
PCT Pub. Date: Apr. 9, 2020

(65) Prior Publication Data
US 2021/0251111 A1    Aug. 12, 2021

(30) Foreign Application Priority Data
Oct. 3, 2018 (JP) .............................. JP2018-188338

(51) Int. Cl.
*H05K 9/00* (2006.01)
*H01L 23/552* (2006.01)

(52) U.S. Cl.
CPC ......... *H05K 9/0088* (2013.01); *H01L 23/552* (2013.01); *H05K 9/0071* (2013.01); *H05K 9/0092* (2013.01)

(58) Field of Classification Search
CPC ........................... H01L 23/552; H05K 9/0088
See application file for complete search history.

(56) References Cited

U.S. PATENT DOCUMENTS 9,974,215 B1 *   5/2018   Jeong .................. H01L 23/3135
10,388,611 B2 *  8/2019   Cho ....................... H01L 23/552
(Continued)

FOREIGN PATENT DOCUMENTS

JP   2017-045946 A   3/2017
JP   2018-129498 A   8/2018
(Continued)

OTHER PUBLICATIONS

Office Action dated Jul. 14, 2021 in corresponding Chinese Application No. 201980061579.3; 14 pages.
(Continued)

*Primary Examiner* — Hung V Ngo
(74) *Attorney, Agent, or Firm* — Maier & Maier, PLLC

(57) ABSTRACT

An electromagnetic-wave shielding sheet is an electromagnetic-wave shielding sheet used to form an electronic component-mounted substrate, the electronic component-mounted substrate including an electromagnetic-wave shielding layer covering at least a part of a step part and an exposed surface of a substrate, in which the electromagnetic-wave shielding sheet is a laminate including a cushion layer and a conductive layer, the conductive layer is an isotropic conductive layer containing a binder resin and a conductive filler, a thickness of the conductive layer is 8 to 70 μm, and a content of the conductive filler in a region on a side opposite to a cushion layer side in the conductive layer is (Continued)

larger than that in a region on the cushion layer side in the conductive layer.

6 Claims, 15 Drawing Sheets

(56) References Cited

U.S. PATENT DOCUMENTS

| | | | |
|---|---|---|---|
| 2004/0000415 A1* | 1/2004 | Rizzo | H01L 24/49 |
| | | | 174/391 |
| 2017/0278804 A1* | 9/2017 | Kawabata | H01L 23/49805 |
| 2021/0242137 A1* | 8/2021 | Matsudo | H05K 9/0045 |

FOREIGN PATENT DOCUMENTS

| | | |
|---|---|---|
| WO | 2014/027673 A1 | 2/2014 |
| WO | 2015/186624 A1 | 12/2015 |
| WO | 2017/111254 A1 | 6/2017 |

OTHER PUBLICATIONS

International Search Report dated Dec. 17, 2019 in corresponding International Application No. PCT/JP2019/038726; 2 pages.

* cited by examiner

ELECTROMAGNETIC-WAVE SHIELDING SHEET AND ELECTRONIC COMPONENT-MOUNTED SUBSTRATE

FIELD

The present invention relates to an electromagnetic-wave shielding sheet that is suitably used for covering at least a part of a step part formed on a substrate due to mounting of an electronic component and an exposed surface of the substrate, and also relates to an electronic component-mounted substrate including an electromagnetic-wave shielding layer formed by such an electromagnetic-wave shielding sheet.

BACKGROUND

In an electronic component-mounted substrate on which electronic components such as IC chips are mounted, because of the increased demand for improved performance and high reliability, a coating layer having various functions is formed on the surfaces of the electronic components. For the formation of such a coating layer, there is a method in which a coating layer that conforms to projections and depressions on a substrate on which electronic components are mounted is formed by performing hot pressing using a sheet-like material in order to simplify the formation process. Japanese Unexamined Patent Application Publication No. 2017-45946 proposes an electromagnetic-wave shielding sheet that absorbs and thereby blocks electromagnetic waves in a high frequency band while reducing the weight and the thickness thereof. Further, International Patent Publication No. WO2015/186624 discloses a conductive adhesive sheet that, by using a simple method, i.e., a pressing process, can make a defect, i.e., deterioration of a shielding property, caused by an increase in an electric resistance less likely to occur even though an electronic component is covered by the sheet. Meanwhile, International Patent Publication No. WO2014/027673 discloses a method in which an electromagnetic-wave shielding sheet is formed on surfaces of electronic components by hot pressing in order to prevent a malfunction from occurring due to an external magnetic field or radio waves coming from the outside and to reduce unnecessary emissions of electric signals generated inside an electronic substrate.

SUMMARY

Japanese Unexamined Patent Application Publication No. 2017-45946, an electromagnetic-wave shielding layer is formed on surfaces of electronic components by hot-pressing an electromagnetic-wave shielding sheet. This electromagnetic-wave shielding sheet includes an electromagnetic-wave shielding layer (a conductive layer) containing a conductive material. In this conductive layer, the content of the conductive material is changed in an inclined manner so that the content on a side opposite to an electronic component side is high and the content on the electronic component side is low. Further, International Patent Publication No. WO2015/186624 discloses an electromagnetic-wave shielding sheet composed of an anisotropic conductive layer and an isotropic conductive layer, in which the anisotropic conductive layer is bonded to an electronic component. For either of the above electromagnetic-wave shielding sheets, a cushion material is used in order to bury the electromagnetic-wave shielding sheet in a projection-and-depression part formed in the substrate on which electronic components are mounted. However, in the above-described electromagnetic-wave shielding sheet, it is difficult to provide sufficient stickability between the conductive layer and the cushion material (hereinafter referred to as cushion stickability), thus causing a problem that they are peeled off during the conveyance thereof or the like and hence the yield rate deteriorates. In addition, at the edge part between the top surface and the side surface of an electronic component, a tensile stress is exerted on the electromagnetic-wave shielding sheet during the hot pressing, thus causing a problem that cracking occurs in the conductive layer and thus the reliability of the connection deteriorates (hereinafter referred to as ground connectivity). International Patent Publication No. WO2014/027673 discloses an electromagnetic-wave shielding film that is used in order to cover protrusions on a substrate and includes a cushion layer and an electromagnetic-wave shielding layer (a conductive layer). However, even in such a laminate, the stickability between the cushion layer and the conductive layer is insufficient, thus causing a problem that the cushion layer and the conductive layer are peeled off during the conveyance thereof or when the laminate is cut into a predetermined size, and hence the yield rate deteriorates. Further, in such an electromagnetic-wave shielding sheet, as shown in FIG. 14, there is a problem that, after the hot pressing, cracking occurs in the electronic component-mounted substrate due to the thermal contraction of the electromagnetic-wave shielding layer (hereinafter referred to as substrate cracking).

The present invention has been made in view of the above-described background and an object thereof is to provide an electromagnetic-wave shielding sheet that has excellent cushion stickability, reliably deforms so as to conform to step parts formed due to mounting electronic components, is reliably connected to a ground pattern formed in a substrate in the step parts, and exhibits a high electromagnetic-wave shielding effect over a long period of time owing to the high reliability of the connection.

Further, another object of the present invention is to provide an electronic component-mounted substrate having a high electromagnetic-wave shielding effect, in which at least a part of step parts formed due to mounting of electronic components and an exposed surface of the substrate is covered with such an electromagnetic-wave shielding sheet.

After repeatedly making intensive studies, the inventors of the present invention have found that a problem to be solved by the present invention can be solved in a below-described aspect, and have completed the present invention.

That is, the present invention provides an electromagnetic-wave shielding sheet used to form an electromagnetic-wave shielding layer constituting a part of an electronic component-mounted substrate, the electronic component-mounted substrate including: a substrate; an electronic component mounted on at least one surface of the substrate; and the electromagnetic-wave shielding layer covering at least a part of a step part formed due to mounting of the electronic component and an exposed surface of the substrate, in which the electromagnetic-wave shielding sheet is a laminate including a cushion layer and a conductive layer, the conductive layer is an isotropic conductive layer containing a binder resin and a conductive filler, a thickness of the conductive layer is 8 to 70 μm, and a content of the conductive filler in a region on a side opposite to a cushion layer side in the conductive layer is larger than the content of the conductive filler in a region on the cushion layer side in the conductive layer.

In the electromagnetic-wave shielding sheet according to the present invention, stickability between the cushion layer and the conductive layer is excellent, and losses are less likely to occur during the conveyance thereof and during the manufacturing of the electronic component-mounted substrate. In addition, the electromagnetic-wave shielding sheet can reliably deform so as to conform to the shape of the step part during hot pressing, so that the electromagnetic-wave shielding sheet is accurately buried in the step part. As a result, the electromagnetic-wave shielding sheet according to the present invention can cover at least a part of the step part and the exposed surface of the substrate, and the formed electromagnetic-wave shielding layer can be connected to a ground pattern formed in the substrate and thereby can be connected to the ground. Further, the electromagnetic-wave shielding sheet blocks unnecessary emission generated by signal lines and the like embedded in the electronic component and the substrate without causing any leaked emission, and reliably provides an electromagnetic-wave shielding effect of preventing a malfunction from occurring due to an external magnetic field or radio waves coming from the outside. In addition, the electronic component-mounted substrate including the electromagnetic-wave shielding layer formed therein according to the present invention can suppress cracking.

In this way, it is possible to provide a highly reliable electronic component-mounted substrate that does not cause a malfunction and to provide such electronic component-mounted substrates with a high yield rate.

DETAILED DESCRIPTION OF THE EMBODIMENTS

Figure 1:
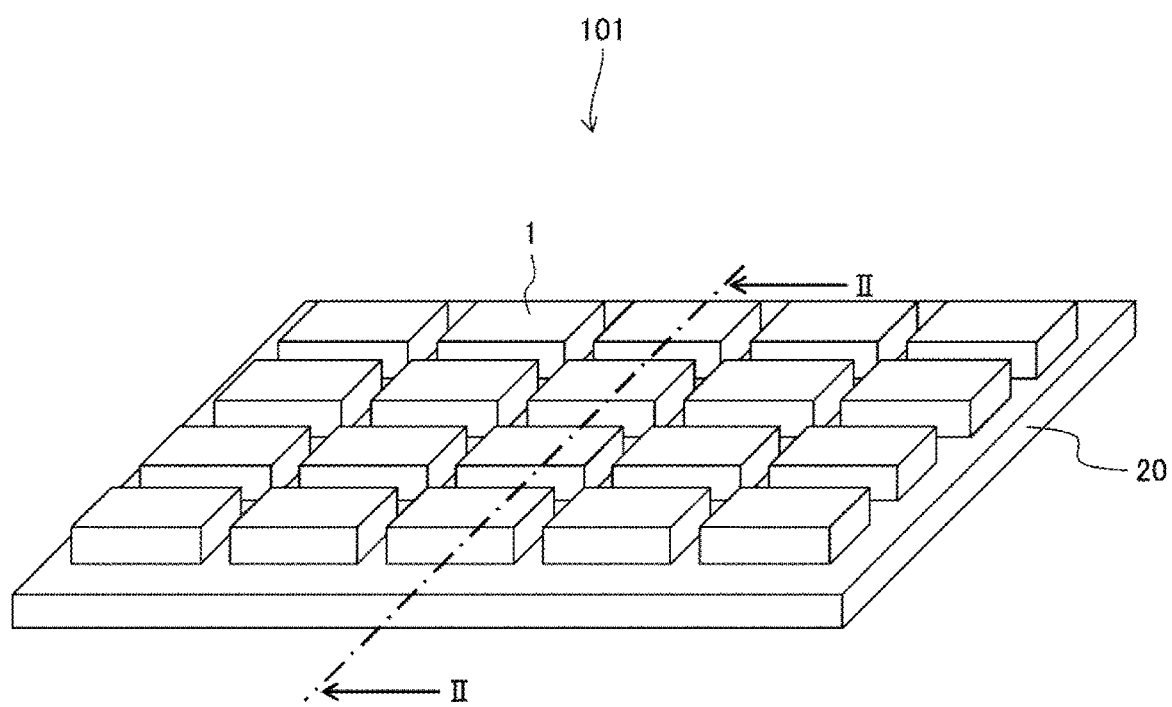
FIG. 1 is a schematic perspective view showing an example of an electronic component-mounted substrate according to an embodiment.

Examples of embodiments to which the present invention is applied will be described hereinafter. Note that numerical values specified in this specification are values obtained by methods disclosed in embodiments or examples. Further, a range of numerical values "A to B" specified in this specification indicates a range of values that are equal to or larger than a numerical value A and are equal to or smaller than a numerical value B. Further, a term "sheet" in this specification includes not only "sheets" defined in JIS but also "films". For clarifying the explanation, the following description and the drawings are simplified as appropriate. Further, the same components are indicated by the same reference numerals even in different embodiments. Each of various components mentioned in this specification may be used alone, or at least two of them may be used in combination unless otherwise specified.

Further, in this specification, "Mw" is a polystyrene-equivalent weight average molecular weight determined by a gel permeation chromatography (GPC) measurement, and average particle diameters $D_{50}$ of a conductive filler, an electromagnetic-wave absorbing filler, and an inorganic filler can be obtained by measurement by a laser diffraction/scattering method.

<<Electronic Component-Mounted Substrate>>

An electronic component-mounted substrate according to this embodiment includes a substrate, electronic components mounted on at least one surface of the substrate, and an electromagnetic-wave shielding layer covering step parts formed due to mounting of the electronic components and an exposed surface of the substrate.

The electromagnetic-wave shielding layer is provided to cover the step parts with projections and depressions (also referred to simply as step parts) on the substrate, and covers at least a part of the side surfaces and the top surfaces of the electronic components and the exposed surface of the substrate.

More preferably, this electromagnetic-wave shielding layer covers the entire surface, and preferably covers the entire surface without leaving any gap.

The electronic component-mounted substrate according to this embodiment provides excellent advantageous effects that the step parts on the substrate can be uniformly covered by the electromagnetic-wave shielding layer and the burying property thereof into the grooves is excellent even under the following conditions: the grooves in the step parts, which are formed due to the mounting of the electronic components, are formed in a grid pattern; and the width (a) of the groove is 50 to 500 μm and the depth (b) of the groove is 1 to 6 times the width (a) of the grooves.

Figure 2:
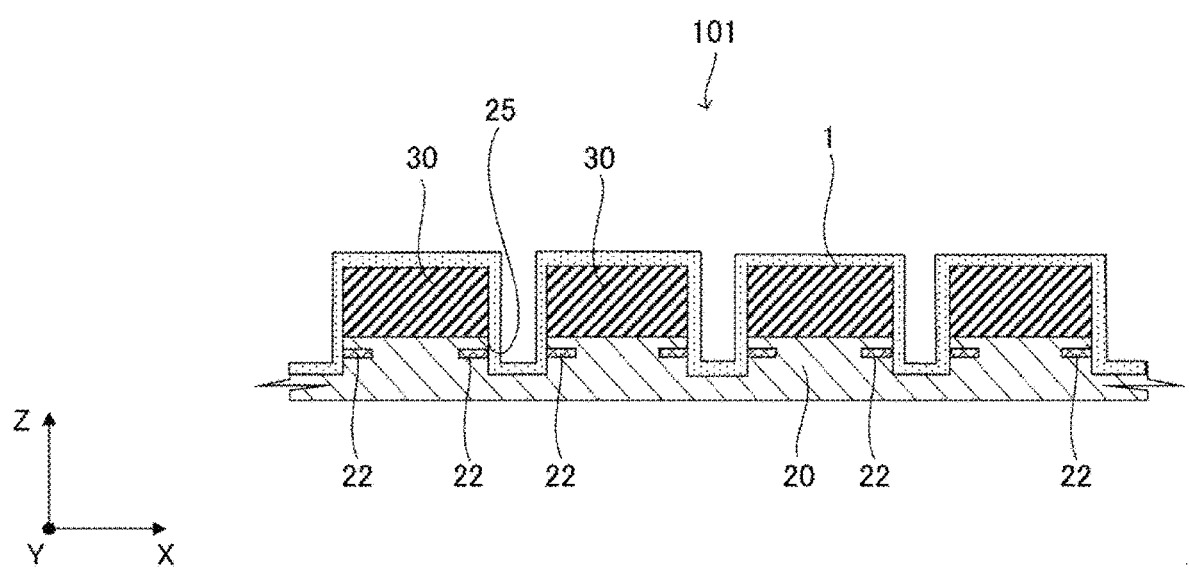
FIG. 2 is a cross-sectional view taken along a line II-II in FIG. 1.

FIG. 1 is a schematic perspective view of an electronic component-mounted substrate according to this embodiment, and FIG. 2 is a cross-sectional view taken along a line II-II in FIG. 1. The electronic component-mounted substrate 101 includes a substrate 20, electronic components 30, an electromagnetic-wave shielding layer 1, and so on.

On the electronic component-mounted substrate 101, other layers such as a film having a scratch resistance property, a water-vapor barrier property, an oxygen barrier property, and the like, and/or a film for enhancing a magnetic-field blocking property may be further laminated.

<Substrate and Electronic Component>

The substrate 20 may be any type of a substrate on which electronic components 30 can be mounted and which can withstand a hot-pressing process (which will be described later), and may be arbitrarily selected therefrom. Examples of the substrate include a work board in which a conductive pattern composed of a copper foil or the like is formed on the surface or the inside thereof, a module-mounted substrate, a printed-circuit board, and a build-up substrate formed by a build-up method or the like. Further, examples are not limited to the rigid substrates. That is, a flexible substrate such as a film substrate or a sheet-like substrate may be used. The conductive pattern is, for example, an electrode/wiring line pattern (not shown) for electrically connecting to the electronic components 30, and a ground pattern 22 for electrically connecting to the electromagnetic-wave shielding layer 1. The ground pattern 2 is preferably disposed on the surface of the substrate in a region where no electronic component is mounted, or disposed inside the substrate and exposed to the side surface of the substrate. In the case where the ground pattern is exposed on the side surface of the substrate, it is also preferable to expose the ground pattern on the side surfaces of grooves that are formed by partially cutting the substrate by half dicing. Further, it is also preferable to expose the ground pattern by completely cutting the substrate by dicing. It is possible to improve the electromagnetic-wave shielding property even further by covering the side surface of the ground pattern with an electromagnetic-wave shielding layer and thereby connecting it to the ground. Inside the substrate 20, an electrode/wiring line pattern, vias (not shown), and the like can be arbitrarily formed.

In the example shown in FIG. 1, the electronic components 30 are arranged in a 5×4 array on the substrate 20. Further, the electromagnetic-wave shielding layer 1 is provided so as to cover the exposed surfaces of the substrate 20 and the electronic components 30. That is, the electromagnetic-wave shielding layer 1 is formed so as to conform to projections and depressions, i.e., the step parts formed due to the mounting of the electronic components 30.

Figure 3:
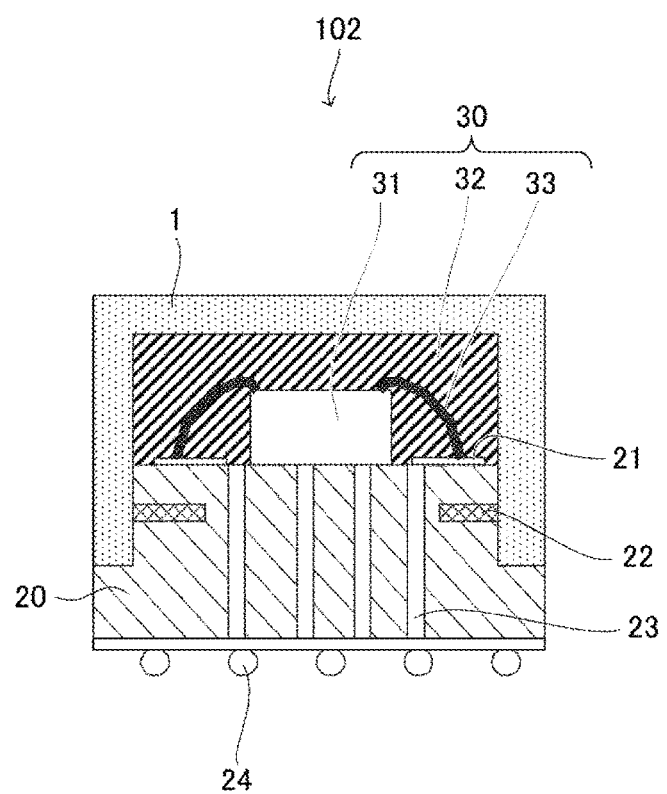
FIG. 3 is a schematic cross-cross-sectional view showing another example of an electronic component-mounted substrate according to an embodiment.

The number, the arrangement, the shape, and the type of electronic components 30 are arbitrarily determined. Instead of adopting the array-like arrangement of the electronic components 30, the electronic components 30 may be disposed at arbitrary positions. When the electronic component-mounted substrate 101 is divided into a plurality of unit modules, it is preferable to form half-dicing grooves 25 so that the unit modules are partitioned in the thickness direction of the substrate from the upper surface of the substrate as shown in FIG. 2. Note that the electronic component-mounted substrate according to this embodiment includes both the substrate that has not been divided into unit modules yet and a plurality of substrates that have been obtained by dividing the substrate into unit modules, i.e., into the plurality of substrates. That is, in addition to the electronic component-mounted substrate 101 on which a plurality of unit modules (electronic components 30) are mounted as shown in FIG. 2, an electronic component-mounted substrate 102 that is obtained by dividing the substrate 101 into a plurality of unit modules as shown in FIG. 3 is also included. Needless to say, an electronic component-mounted substrate that is obtained by mounting one electronic component 30 on a substrate 20 and covering it with an electromagnetic-wave shielding layer, instead of being formed through the above-described dividing process, is also included. That is, the electronic component-mounted substrate according to this embodiment includes any type of structures in which at least one electronic component is mounted on a substrate, and at least a part of a step part formed due to the mounting of the electronic component is covered with an electromagnetic-wave shielding layer.

The electronic components 30 include any type of a component in which an electronic element such as a semiconductor integrated circuit is integrally covered with a sealing resin. For example, there is an aspect in which a semiconductor chip 31 in which an integrated circuit (not shown) is formed is sealed with a sealing resin 32 (see FIG. 3). The substrate 20 and the semiconductor chip 31 are electrically connected to wiring lines or electrodes 21 formed in the substrate 20 through contact areas between the substrate 20 and the semiconductor 31, or through bonding wires 33, solder balls (not shown) or the like. Examples of the electronic component include, in addition to the semiconductor chip, an inductor, a thermistor, a capacitor, and a resistor.

The edge of the step part of the electronic component preferably has R of 50 μm or shorter. Unless any special process is carried out, the edge part of the groove formed by half-dicing has an acute angle and its R is 50 μm or shorter. Although there is method for making R of the edge part more obtuse in order to reduce cracking in the electromagnetic-wave shielding layer, the man-hour and the cost could increase. In contrast, when an electromagnetic-wave shielding sheet according to this embodiment is used, there is an excellent advantageous effect that it is possible to uniformly form a coating layer without causing cracking in the electromagnetic-wave shielding layer even when the edge has an acute angle.

The electronic components 30 and the substrate 20 according to this embodiment can be widely applied to publicly-known aspects. In the example shown in FIG. 3, the semiconductor chip 31 is connected to solder balls 24 disposed on the under surface of the substrate 20 through inner through-holes 23. Further, a ground pattern 22 for electrically connecting to the electromagnetic-wave shielding layer is formed inside the substrate 20. This ground pattern 22 is disposed so as to be exposed on the side surfaces of the substrate 20. Further, one or a plurality of electronic elements or the like can be provided inside the electronic components 30.

<Electromagnetic-Wave Shielding Layer>

An electromagnetic-wave shielding layer is formed by the electromagnetic-wave shielding sheet according to this embodiment.

An example is described hereinafter with reference to FIG. 2. An electromagnetic-wave shielding layer 1 is obtained by placing an electromagnetic-wave shielding sheet on the substrate 20 on which electronic components 30 are mounted and hot-pressing the placed electromagnetic-wave shielding sheet. The electromagnetic-wave shielding layer 1 is formed as a conductive layer of the electromagnetic-wave shielding sheet is cured after being deformed, and the conductive layer contains a binder resin and a conductive filler. In the electromagnetic-wave shielding layer, conductive fillers are in contact with each other in a continuous manner, so that the electromagnetic-wave shielding layer is an isotropic conductive layer that exhibits isotropic conductivity.

The electromagnetic-wave shielding layer 1 blocks unnecessary emission generated by signal lines and the like embedded in the electronic components 30 and/or the substrate 20, and can prevent a malfunction from occurring due to an external magnetic field or radio waves coming from the outside.

The region covered by the electromagnetic-wave shielding layer is preferably the entire region of the step parts (the projection-and-depression parts) formed due to the mounting of the electronic components 30. In order to achieve a satisfactory shielding effect, the electromagnetic-wave shielding layer is preferably connected to the ground pattern 22 that is exposed on the side surface or the upper surface of the substrate 20 and/or to a ground pattern (not shown) such as wiring lines for connecting electronic components.

The thickness of the electromagnetic-wave shielding layer may be designed as desired according to the use thereof. For use in which it is desired to reduce the thickness, the thickness of the electromagnetic-wave shielding layer covering the upper surfaces and the side surfaces of the electronic components is preferably 8 to 70 μm, more preferably in a range of 15 to 65 μm, and still more preferably 20 to 60 μm. By adopting the above-described thickness, the size of the component-mounted substrate can be reduced and a high shielding property thereof can be ensured.

The parts in the electromagnetic-wave shielding layer where cracking is likely to occur are parts that cover the edge parts of the electronic components 30. When the electromagnetic-wave shielding layer is cracked in the edge part of an electronic component, the electromagnetic-wave shielding effect could be lowered. Therefore, the covering property in the step parts is particularly important.

[Electromagnetic-Wave Shielding Sheet]

An electromagnetic-wave shielding sheet according to this embodiment is a laminate including a cushion layer and a conductive layer. Examples of the method for laminating these layers include a method for laminating layers one by one, a method for applying or printing a conductive resin composition on a cushion layer, and a method for bonding layers to each other through a pressure-sensitive adhesive layer or an adhesive layer. Further, the conductive layer is an isotropic conductive layer containing a binder resin and a conductive filler, and has a thickness of 8 to 70 μm. Further, the content of the conductive filler in a region along a surface on a side opposite to a cushion layer side in the conductive layer is larger than the content of the conductive filler in a region along a surface on the side that is in contact with the cushion layer in the conductive layer. In other words, when the surface that is in contact with the cushion layer is defined as a b-surface and the surface on the opposite side is defined as an a-surface, the content of the conductive filler on the a-surface side is larger than the content of the conductive filler on the b-surface side.

By using such an electromagnetic-wave shielding sheet, it is possible to form an electromagnetic-wave shielding sheet that has excellent cushion stickability, reliably deforms so as to conform to step parts formed due to mounting electronic components, is reliably connected to a ground pattern formed in a substrate in the step parts, and exhibits a high electromagnetic-wave shielding effect over a long period of time owing to the high reliability of the connection.

It is essential that the cushion layer and the conductive layer be in close contact until they are hot-pressed. The peel strength of the cushion layer from the conductive layer is preferably 0.2-3 N/25 mm, and more preferably 0.5-2.5 N/25 mm. By making the peel strength equal to or higher than 0.2 N/25 mm, delamination is suppressed during the transportation and during the cutting, and hence the yield rate is improved. Further, by making the peel strength equal to or lower than 3 N/25 mm, the cushion layer can be easily peeled off without causing damage in the shielding layer after the hot pressing. The above-described peel strength can be controlled by the conductive filler occupation area ratio (B) of the conductive layer (which will be described later). In addition, the peeling strength can be also controlled by the pressure and the temperature during the laminating process and by surface activation through a corona treatment for the cushion layer.

Figure 4:
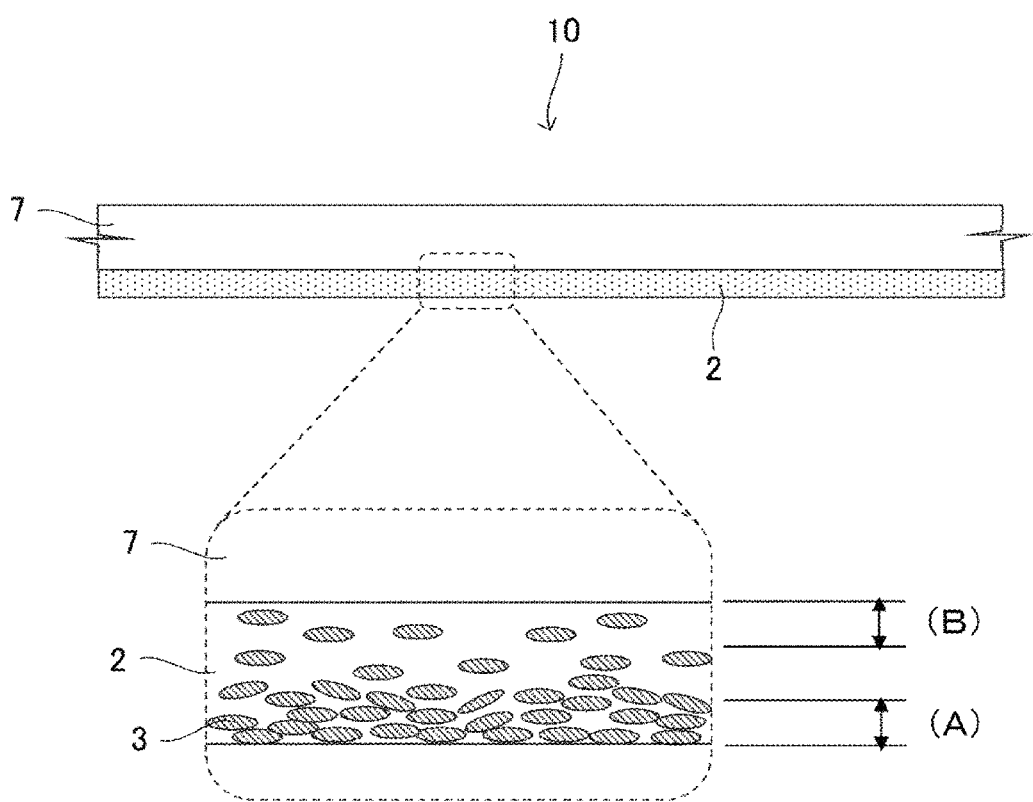
FIG. 4 is a schematic cross-cross-sectional view showing an example of an electromagnetic-wave shielding sheet according to an embodiment.

As shown in FIG. 4, the electromagnetic-wave shielding sheet according to this embodiment includes the conductive layer 2 and the cushion layer 7 formed on one of the main surfaces of the conductive layer 2. A mold-release base material (not shown) may be laminated on the other main surface of the conductive layer.

(Cushion Layer)

The cushion layer 7 is a layer that is melted during the hot pressing, and functions as a cushion material for promoting the conforming property of the conductive layer 2 to the step parts formed due to the mounting of the electronic components 30. In addition, the cushion layer 7 is a layer that has a mold-release property and is not bonded to the conductive layer 2, and is a layer that can be peeled off from the conductive layer 2 after the hot-pressing step.

Note that the cushion layer 7 may include a mold-release layer, and in such a case, the cushion layer 7 means a structure in which a member having a cushioning property is combined with a mold-release layer.

The cushion layer can be formed by a thermoplastic resin composition containing at least a thermoplastic resin. Further, the thermoplastic resin composition may contain a plasticizer, a thermosetting agent, an inorganic filler, and the like in addition to the thermoplastic resin.

Examples of the thermoplastic resin include a polyolefin-based resin, an acid-grafted acid-modified polyolefin-based resin, a copolymer resin of polyolefin and an unsaturated ester, a vinyl-based resin, a styrene-acrylic resin, a diene-based resin, a cellulose-based resin, a polyamide resin, a polyurethane resin, a polyester resin, a polycarbonate resin, a polyimide-based resin, and a fluorocarbon resin.

Among them, the polyolefin-based resin, the acid-grafted acid-modified polyolefin-based resin, the copolymer resin of polyolefin and an unsaturated ester, and the vinyl-based resin are preferred. One type of a thermoplastic resin can be used alone, or two or more types thereof can be mixed at an arbitrary ratio as required and used.

The polyolefin-based resin is preferably a homopolymer such as ethylene, propylene, or an α-olefin compound, or a copolymer thereof. Specific examples include low-density polyethylene, very-low-density polyethylene, linear low-density polyethylene, high-density polyethylene, a polypropylene homopolymer, and a polypropylene copolymer.

Among them, the polyethylene resin and the polypropylene resin are preferred, and the polyethylene resin is more preferred.

The acid-modified polyolefin-based resin is preferably a polyolefin resin to which maleic acid, acrylic acid, methacrylic acid, itaconic acid, or the like is grafted.

Among them, the maleic acid-modified polyolefin resin is preferred.

Examples of the unsaturated ester in the copolymer resin of polyolefin and an unsaturated ester include methyl acrylate, ethyl acrylate, isobutyl acrylate, n-butyl acrylate, isooctyl acrylate, methyl methacrylate, isobutyl methacrylate, dimethyl maleate, diethyl maleate, and glycidyl methacrylate.

Among them, an ethylene-glycidyl methacrylate copolymer resin composed of ethylene, which is contained as the polyolefin, and glycidyl methacrylate, which is contained as the unsaturated ester, is preferred.

The vinyl-based resin is preferably a polymer obtained by polymerization of a vinyl ester such as vinyl acetate, and a copolymer of a vinyl ester and an olefin compound such as ethylene. Specific examples include an ethylene-vinyl acetate copolymer, an ethylene-vinyl propionate copolymer, and partially-saponified polyvinyl alcohol.

Among them, an ethylene-vinyl acetate copolymer is preferred.

The styrene-acrylic resin is preferably a homopolymer composed of styrene, (meth)acrylonitrile, acrylamides, maleimides, and the like, or a copolymer thereof. Specific examples include syndiotactic polystyrene, polyacrylonitrile, and an acrylic copolymer.

The diene-based resin is preferably a homopolymer or a copolymer of a conjugated diene compound such as butadiene or isoprene, and a hydrogenated product thereof. Specific examples include styrene-butadiene rubber, a styrene-isoprene block copolymer, a styrene-ethylene-butylene-styrene block copolymer, a styrene-ethylene-propylene-styrene block copolymer, a styrene-isoprene-styrene block copolymer, a styrene-butylene-butadiene-styrene block copolymer, and a mixture of a styrene-ethylene-butylene-styrene block copolymer and a styrene-ethylene-butylene block copolymer.

The cellulose-based resin is preferably a cellulose acetate butyrate resin. The polycarbonate resin is preferably bisphenol A polycarbonate.

The polyimide-based resin is preferably a thermoplastic polyimide, a polyamideimide resin or a polyamic acid-type polyimide resin.

Figure 6:
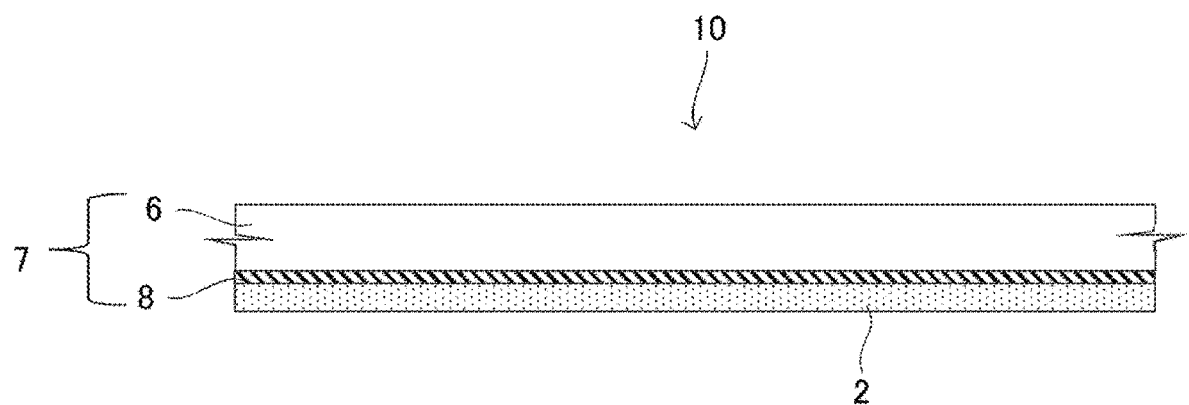
FIG. 6 is a schematic cross-cross-sectional view showing another example of an electromagnetic-wave shielding sheet according to an embodiment.

As shown in FIG. 6, the cushion layer 7 may include a mold-release layer 8 in addition to the cushioning member 6 in order to facilitate the separation of the cushion layer and the electromagnetic-wave shielding layer after the hot pressing. As the mold-release layer 8, a layer composed of polypropylene, polymethylpentene, a cyclic olefin polymer, silicone, and a fluorocarbon resin is preferably formed. Among them, the polypropylene, the polymethylpentene, the silicone, and the fluorocarbon resin are more preferred. In addition to the above-described aspect, it is also preferable to coat the cushioning member 6 with a mold-release agent such as alkyd or silicone.

The thickness of the mold-release layer is preferably 0.001 to 70 µm, and more preferably 0.01 to 50 µm.

Regarding commercially-available materials, "CR1012", "CR1012MT4", "CR1031", "CR1033", "CR1040", "CR2031MT4", and the like manufactured by Mitsui Chemicals Tohcello. Inc. can be used for the cushion layer. These commercially-available cushion layers have a layer structure in which both surfaces of the cushion layer are sandwiched by polymethylpentene layers which are used as mold-release layers, and the integrated structure thereof is referred to as a cushion layer in this specification.

The thickness of the cushion layer is preferably 50 to 300 µm, more preferably 75 to 250 µm, and still more preferably 100 to 200 µm. By making the thickness equal to or larger than 50 µm, the burying property can be improved. By making the thickness equal to or smaller than 300 µm, the handleability of the electromagnetic-wave shielding sheet can become excellent. Note that when the cushion layer 7 include a mold-release layer(s), the thickness thereof is a value that includes (the thickness of) the mold-release layer(s).

(Conductive Layer)

The conductive layer is a layer that is provided in order to form an electromagnetic-wave shielding layer, and contains at least a binder resin and a conductive filler. The conductive layer functions as an electromagnetic-wave shielding layer after the hot pressing. The thickness of the conductive layer is 8 to 70 µm. Further, the conductive layer is characterized in that: a conductive filler occupation area ratio (A) in a region from the interface opposite to the interface with the cushion layer to 30% of the thickness is 25 to 55%; a conductive filler occupation area ratio (B) in a region from the interface with the cushion layer to 30% of the thickness is 15 to 40%; and the conductive filler occupation area ratio (A) is higher than the conductive filler occupation area ratio (B).

The thickness of the conductive layer is 8 to 70 µm, preferably in a range of 15 to 65 µm, and more preferably 20 to 60 µm. As a result, it is possible to effectively provide the shielding property, the burying property, and the ground connectivity, and thereby to reduce cracking in the electronic component-mounted substrate.

Regarding the method for measuring the thicknesses of the conductive layer and the above-described cushion layer, it is possible to measure the thickness by using a contact-type film thickness meter or by measurement through observation of the cross section of the layer.

<<Conductive Filler Occupation Area Ratio (A)>>

The conductive filler occupation area ratio (A) in this specification indicates, on a cut surface at which the electromagnetic-wave shielding sheet is cut in the thickness direction as shown in FIG. 4, the content ratio of the conductive filler in the conductive layer in a region from the side opposite to the cushion layer side to 30% of the thickness.

More specifically, a cut surface of an electromagnetic-wave shielding sheet in the thickness direction is formed by cutting the electromagnetic-wave shielding sheet by the emission of an ion beam by using a cross section polisher (SM-09010 manufactured by JEOL Ltd.).

The conductive filler occupation area ratio (A) can be obtained by a method that will be described in examples (which will be described later).

Note that the region from the interface opposite to the interface with the cushion layer to 30% of the thickness is a region, in the thickness of the electromagnetic-wave shielding sheet, from the interface of the conductive layer opposite to the interface thereof with the cushion layer to 30% of the thickness. For example, when the thickness of the conductive layer is 100 µm, the region on the cut surface in the thickness direction is from the interface of the conductive layer opposite to the interface thereof with the cushion layer to 30 µm in the thickness.

The conductive filler occupation area ratio (A) is 25 to 55%, preferably in a range of 30 to 52%, and more preferably 35 to 48%. By making the conductive filler occupation area ratio (A) equal to or higher than 25%, the ground connectivity can be improved. Further, by making the conductive filler occupation area ratio (A) equal to or lower than 55%, the burying property can be improved.

<<Conductive Filler Occupation Area Ratio (B)>>

The conductive filler occupation area ratio (B) in this specification indicates, on a cut surface at which the electromagnetic-wave shielding sheet 10 is cut in the thickness direction as shown in FIG. 4, the content ratio of the conductive filler 3 in the conductive layer 2 in a region from the cushion layer side to 30% of the thickness. The conductive filler occupation area ratio (B) can be obtained by a method similar to that for the conductive filler occupation area ratio (A), except that the range-specified region on the cut surface of the conductive layer 2 is to 30% of the thickness on the cushion layer side.

The conductive filler occupation area ratio (B) is 15 to 40%, preferably in a range of 18 to 37%, and more preferably 22 to 34%. By making the conductive filler occupation area ratio (B) equal to or higher than 15%, the shielding property can be improved and the cracking in the substrate can be suppressed. Further, by making the conductive filler occupation area ratio (B) equal to or lower than 40%, the peel strength from the cushion layer can be increased and the stickability with the cushion layer can be improved.

The difference of the conductive filler occupation area ratio between the conductive filler occupation area ratios (A) and (B) expressed by the below-shown Expression (1) is preferably 1 to 31%, more preferably 3 to 28%, and still more preferably 8 to 25%. By adjusting the difference to a value in the above-described range, the shielding property and the ground connectivity are improved, and the substrate cracking can be suppressed even further.

Conductive Filler Occupation Area Ratio Difference (%)=Conductive Filler Occupation Area Ratio ($A$)−Conductive Filler Occupation Area Ratio ($B$)   Expression (1)

There are no particular restrictions on the region between the regions for the conductive filler occupation area ratios (A) and (B), i.e., on the remaining region of 40% of the thickness. However, it is preferred that the conductive filler occupation area ratio in this region has a value between the ratios (A) and (B).

The conductive layer of the electromagnetic-wave shielding sheet is characterized in that the conductive filler occupation area ratio (A) is higher than the conductive filler occupation area ratio (B). As a result, the reliability of the connection to the ground pattern is improved. Further, the amount of the binder component in the surface that is in contact with the cushion layer is relatively large, so that the stickability with the cushion layer becomes excellent and the delamination becomes less likely to occur during the conveyance thereof and the cutting thereof. As a result, the yield rate is improved.

<<Method for Manufacturing Conductive Layer>>

Figure 5:
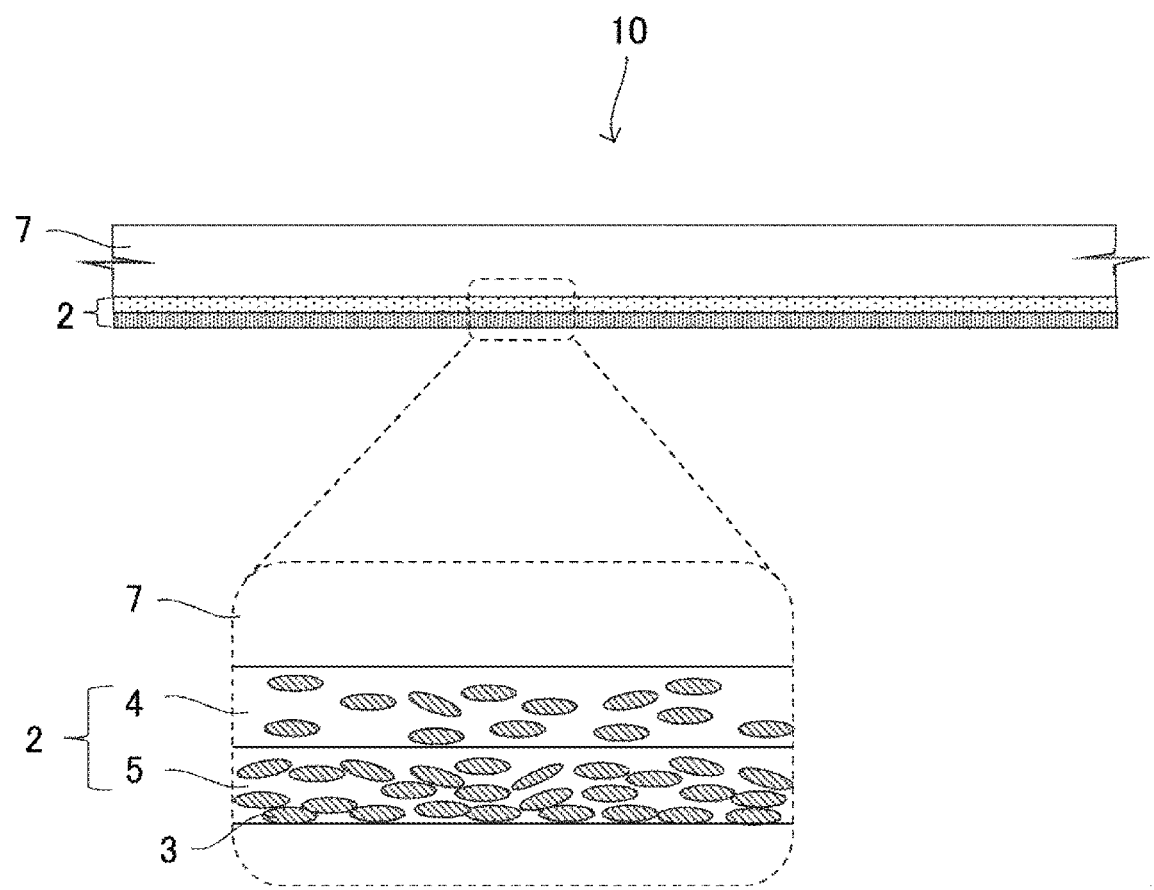
FIG. 5 is a schematic cross-cross-sectional view showing another example of an electromagnetic-wave shielding sheet according to an embodiment.

As shown in FIG. 5, a conductive layer like the one described above can be formed by forming at least two types of isotropic conductive layers containing different amounts of the conductive filler 3, which will eventually become the conductive layer 5 on the side opposite to the cushion layer 7 side and the conductive layer 4 on the cushion layer side, respectively, and laminating them. Each of the isotropic conductive layers can be formed by coating a conductive resin composition containing a binder resin and a conductive filler on a mold-release base material and then drying the coated conductive resin composition. Further, there are no restrictions on the isotropic conductive layers as long as they have an isotropic conductive property over the entire conductive layers and the content of the conductive filler 3 in the region on the side opposite to the cushion layer 7 side is larger than the content of the conductive filler 3 in the region on the cushion layer 7 side.

In the case where the conductive layer 2 is formed of two layers, i.e., the conductive layers 5 and 4, since the conductive layer 2 is formed by laminating the conductive layers 5 and 4 in this order, and the conductive layer 4 is laminated on the cushion layer, the content of the conductive filler in the conductive layer 5 is set to a high value. The content of the conductive filler in the conductive layer 5 is preferably 61 to 78 mass %, and more preferably 64 to 76 mass %. The content of the conductive filler in the conductive layer 4 is preferably 51 to 67 mass %, and more preferably 53 to 65 mass %.

After that, an electromagnetic-wave shielding sheet can be formed by bonding the conductive layer 4 to the cushion layer to each other. Alternatively, an electromagnetic-wave shielding sheet can be formed by forming the conductive layer 4 by directly coating the cushion layer 7 with a conductive resin composition and boning the formed conductive layer 4 to the conductive layer 5 disposed on the mold-release base material.

Figure 15:
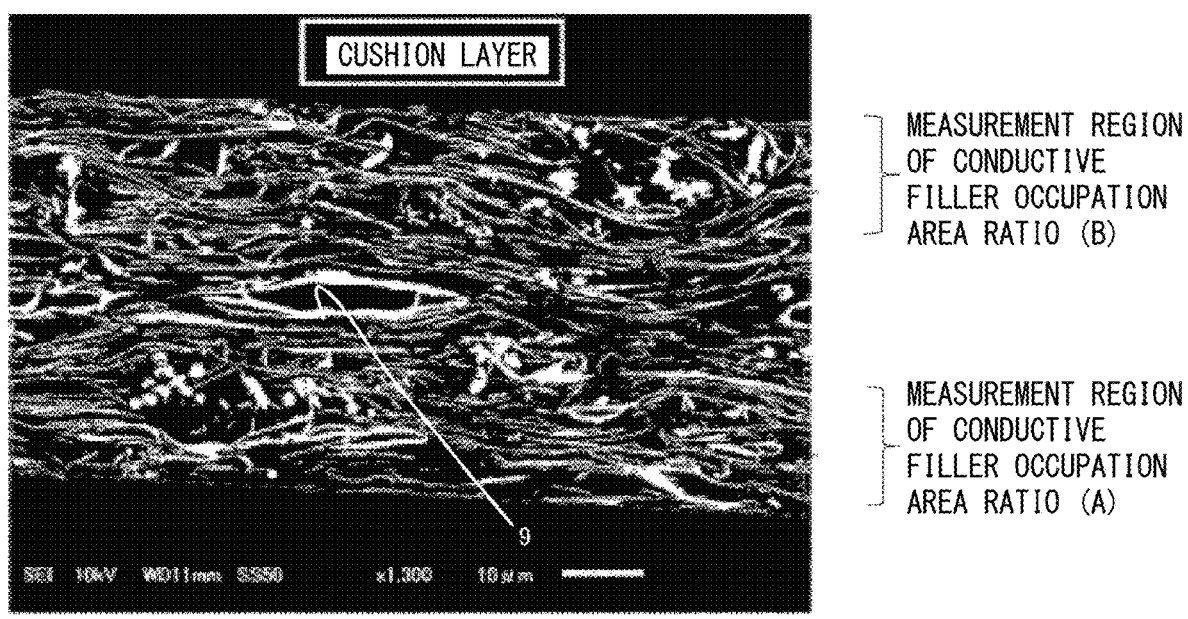
FIG. 15 shows an example of a displayed image for measuring a conductive filler occupation area ratio (A) and that of a conductive filler occupation area ratio (B).

The conductive layer preferably includes holes. The holes are trapped air bubbles or a plurality of bubbles inside the conductive layer that are observed in the cross section of the conductive layer when the conductive layer is cut in the thickness direction, and FIG. 15 shows an example thereof. As shown in FIG. 15, holes 9 are preferably present at the center of the conductive layer in the cross section when the conductive layer is cut in the thickness direction. Because of the presence of holes in the conductive layer, the pressure that is caused by the pressing toward the protrusions, which are formed due to mounting of the electronic components, during the hot-pressing of the electromagnetic-wave shielding sheet is moderately alleviated, so that the electromagnetic-wave shielding layer can be formed more uniformly. As a result, the burying property into the step parts becomes excellent and the ground connectivity is improved. The holes may disappear or remain inside the electromagnetic-wave shielding layer after the hot pressing.

Further, in addition to the above-described manufacturing method, it is possible to obtain an electromagnetic-wave shielding layer by coating the mold-release base material with a conductive resin composition containing a binder resin, a conductive filler, and a solvent, making the conductive filler precipitate so that a gradient in concentration of the conductive filler is formed, and then drying the conductive resin composition. It is possible to control the precipitation of the conductive filler by controlling the viscosity, the thixotropy, and the precipitation time of the conductive resin composition.

After that, an electromagnetic-wave shielding sheet can be formed by bonding, to the cushion layer, the surface of the conductive layer, which is disposed on the mold-release base material, located on the side on which the concentration of the conductive filler is low.

As the method for coating the conductive layer with a conductive resin composition, for example, a gravure coating method, a kiss coating method, a die coating method, a lip coating method, a comma coating method, a blade method, a roll coating method, a knife coating method, a spray coating method, a bar coating method, a spin coating method, or a dip coating method can be used.

<<Binder Resin>>

A binder resin by which the conductive layer is formed will be described. A thermosetting resin is preferably used as the binder resin. As the thermosetting resin, a curable compound reaction type can be used. Further, the thermosetting resin may be self-crosslinked. When a thermosetting resin is used, it preferably has a reactive functional group capable of reacting with a curable compound.

Examples of the suitable thermosetting resin include a polyurethane resin, a polyurethane urea resin, an acrylic resin, a polyester resin, a polyamide resin, an epoxy-based resin, polystyrene, a polycarbonate resin, a polyamideimide resin, a polyester amide resin, a polyether ester resin, and a polyimide resin. The thermosetting resin may have a self-crosslinkable functional group. For example, the thermosetting resin used under severe conditions during the reflowing preferably includes at least one of an epoxy-based resin, an epoxy ester-based resin, a urethane-based resin, a urethane urea-based resin, a polycarbonate-based resin, and polyamide. Further, a thermosetting resin and a thermoplastic resin can be used together as long as they can withstand the heating process.

Examples of the reactive functional group of the thermosetting resin include a carboxyl group, a hydroxyl group, and an epoxy group. When the thermosetting resin has a carboxyl group, the acid value of the thermosetting resin is preferably 3 to 30. By adjusting the acid value to a value in this range, an effect that the resistance of the edge part against breaking is improved can be obtained. A more preferred range of the acid value is 4 to 20, and a still more preferred range is 5 to 10.

The weight average molecular weight Mw of the thermosetting resin is preferably 20,000 to 150,000. By adjusting the weight average molecular weight to 20,000 or larger, the scratch resistance can be effectively improved. Further, by adjusting it to 150,000 or smaller, the effect of improving the step conforming property is obtained.

The curable compound has a functional group that can be crosslinked with the reactive functional group of the thermosetting resin. The curable compound is preferably an epoxy compound, an isocyanate compound, a polycarbodiimide compound, an aziridine compound, an acid anhydride group-containing compound, a dicyandiamide compound, an amine compound such as an aromatic diamine compound, a phenol compound such as a phenol novolak resin, an organometallic compound, or the like. The curable compound may be a resin. In such a case, the thermosetting resin and the curable compound are distinguished from each other in such a manner that one of them that is contained in a larger amount is regarded as the thermosetting resin and the other contained in a smaller amount is regarded as the curable compound.

The structure and the molecular weight of the curable compound can be designed as appropriate according to the use.

The curable compound is preferably contained in an amount of 1 to 70 mass parts, more preferably 3 to 65 mass parts, and still more preferably 3 to 60 mass parts based on 100 mass parts of the thermosetting resin.

The epoxy compound is not limited to any particular compounds as long as it has an epoxy group, but is preferably a polyfunctional epoxy compound. A crosslinked structure can be obtained as the epoxy group of the epoxy compound is thermally crosslinked with the carboxyl group or the hydroxyl group of the thermosetting resin in the hot pressing or the like. An epoxy compound that is in a liquid state at a normal temperature and a normal pressure is suitable as the above-described epoxy compound.

In addition to the aforementioned materials, a tackifier resin and/or a thermoplastic resin may be used as the binder resin. Examples of the suitable thermoplastic resin include a polyolefin-based resin, a vinyl-based resin, a styrene-acrylic resin, a diene-based resin, a terpene-based resin, a petroleum-based resin, a cellulosic-based resin, a polyamide-based resin, a polyurethane-based resin, a polyester-based resin, a polycarbonate-based resin, and a fluorocarbon-based resin. Examples of the tackifier resin include a rosin-based resin, a terpene-based resin, an alicyclic petroleum-based resin, and an aromatic petroleum-based resin. Further, a conductive polymer can also be used. Examples of the conductive polymer include polyethylene dioxythiophene, polyacetylene, polypyrrole, polythiophene, and polyaniline.

<<Conductive Filler>>

Examples of the conductive filler include a metallic filler, a conductive ceramics filler, and a mixture thereof. Examples of the metallic filler include: a powder of meal such as gold, silver, copper, and nickel; a powder of an alloy such as solder; and a core shell-type filler such as a silver-coated copper powder, a gold-coated copper powder, a silver-coated nickel powder, and a gold-coated nickel powder. In order to obtain an excellent conductive property, a conductive filler containing silver is preferred. From the point of view of cost, a silver-coated copper powder is particularly preferred. The content of silver in the silver-coated copper is preferably 6 to 20 mass %, more preferably 8 to 17 mass %, and still more preferably 10 to 15 mass % based on 100 mass % of the conductive filler. In the case of the core shell-type filler, the coating ratio of the coating layer to the core part is, on average, preferably 60 mass % or higher, more preferably 70 mass % or higher, and still more preferably 80 mass % or higher based on 100 mass % of the entire surface. The core part may be non-metallic. However, from the point of view of conductivity, a conductive material is preferred and a metallic filler is more preferred.

The shape of the conductive filler is preferably flaky (scaly). Alternatively, a flaky conductive filler and a conductive filler having other shapes may be used in combination. The shape of the conductive filler used in combination with the other conductive filler is not limited to any particular shapes, but is preferably dendritic (dendrite), fibrous, needle-like, or spherical. The conductive filler used in combination may be used alone or in a mixed state. In the case where the conductive filler is used in combination, examples of the combination include a combination of a flaky conductive filler and a dendritic filler, a combination of a flaky conductive filler, a dendritic conductive filler and a spherical conductive filler, and a combination of a flaky conductive filler and a spherical conductive filler. Among them, in order to improve the shielding property and the ground connectivity of the electromagnetic-wave shielding layer, the use of a flake conductive filler alone or a combination of a flake conductive filler and a dendritic conductive filler is more preferred.

The average particle diameter $D_{50}$ of the flaky conductive filler is preferably 2 to 100 µm, and more preferably 2 to 80 µm. The average particle diameter is more preferably 3 to 50 µm, and particularly preferably 5 to 20 µm. The preferred range of the average particle diameter $D_{50}$ of the dendritic conductive filler is preferably 2 to 100 µm, and more preferably 2 to 80 µm. The average particle diameter is more preferably 3 to 50 µm, and particularly preferably 5 to 20 µm.

Further, the conductive resin composition constituting the conductive layer may contain, in addition to the binder resin and the conductive filler, a coloring agent, a flame retardant, an inorganic additive, a lubricant, a blocking inhibitor, and the like.

Examples of the coloring agent include an organic pigment, carbon black, ultramarine, colcothar, zinc oxide, titanium oxide, and graphite. Among them, by containing a blackish coloring agent, the visibility of printing on the shielding layer is improved.

Examples of the flame retardant include a halogen-containing flame retardant, a phosphorus-containing flame retardant, a nitrogen-containing flame retardant, and an inorganic flame retardant.

Examples of the inorganic additive include glass fibers, silica, talc, and ceramics.

Examples of the lubricant include a fatty acid ester, a hydrocarbon resin, paraffin, higher fatty acid, fatty-acid amide, aliphatic alcohol, metallic soap, and modified silicone.

Examples of the blocking inhibitor include calcium carbonate, silica, polymethylsilsesquioxane, and aluminum silicate salt.

<Method for Manufacturing Electronic Component-Mounted Substrate>

An electronic component-mounted substrate according to this embodiment can be manufactured by:

a step (a) of mounting electronic components on a substrate;

a step (b) of placing an electromagnetic-wave shielding sheet formed by laminating a cushion layer and a conductive layer in this order on the substrate, on which the electronic components have been mounted, in such a manner that the conductive layer is opposed to the substrate;

a step (c) of obtaining an electromagnetic-wave shielding layer by bonding the electromagnetic-wave shielding sheet to the substrate by hot pressing so that the conductive layer conforms to step parts formed due to the mounting of the electronic components and an exposed surface of the substrate; and a step (d) of removing the cushion layer.

An example of the method for manufacturing an electronic component-mounted substrate according to this embodiment will be described hereinafter with reference to FIGS. 7 to 11. However, the method is not limited to this example.

"Step (a)"

A step (a) is a step of mounting electronic components on a substrate.

Figure 7:
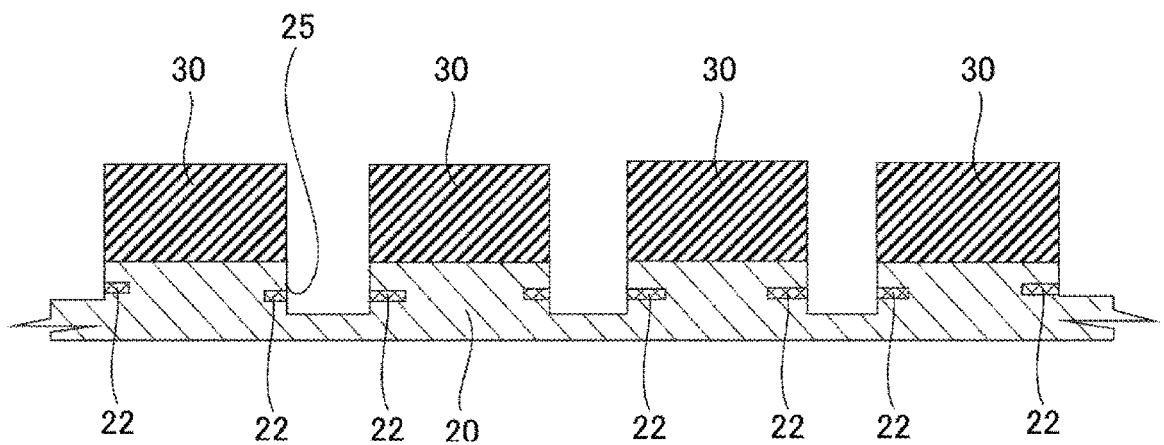
FIG. 7 is a cross-cross-sectional view of an electronic component-mounted substrate in a manufacturing process according to an embodiment.

Firstly, electronic components 30 are mounted on a substrate 20. FIG. 7 shows an example of a substrate obtained by the step (a) in a manufacturing process for an electronic component-mounted substrate according to this embodiment. As shown in the FIG. 7, semiconductor chips (not shown) are mounted on the substrate 20, and the substrate 20 on which the semiconductor chips are formed is sealed with a sealing resin. Then, the molded resin and the substrate 20 are half-cut by dicing or the like so that the cutting reaches the inside of the substrate 20 from the top of the resin between electronic components. Alternatively, electronic components 30 may be arranged in an array on a substrate that is half-cut in advance. Note that, in the example shown in FIG. 7, the electronic component 30 means an integrated object that is obtained by sealing a semiconductor chip by molding, and may be any type of an electronic element protected by an insulating material. The half-cutting incudes an aspect in which the cutting reaches the surface of the substrate as well as the cutting reaching the inside of the substrate. Further, the substrate may be completely cut at this stage. In such a case, it is preferred to place a substrate on a base body equipped with pressure-sensitive adhesive tape so that the substrate is not displaced.

In order to prevent the unevenness of the burying property, the grooves between the electronic components are preferably formed in a grid pattern. Further, the depth (b) of the grooves is preferably 1 to 6 times the width (a) of the grooves, and the width (a) of the grooves is preferably 50 to 500 μm in order to prevent the substrate cracking.

In the case of the sealing by molding, the material for the sealing resin is not limited to any particular resins. However, a thermosetting resin is typically used. The method for forming sealing by using a sealing resin is not limited to any particular methods. Examples of the method include printing, laminating, transfer molding, compression, and casting. The sealing by molding is optional, and the method for mounting electronic components can also be arbitrarily changed.

"Step (b)"

In a step (b), after the step (a), the electromagnetic-wave shielding sheet is placed on the substrate, on which the electronic component has been mounted, in such a manner that the conductive layer 2 is opposed to the substrate.

Figure 8:
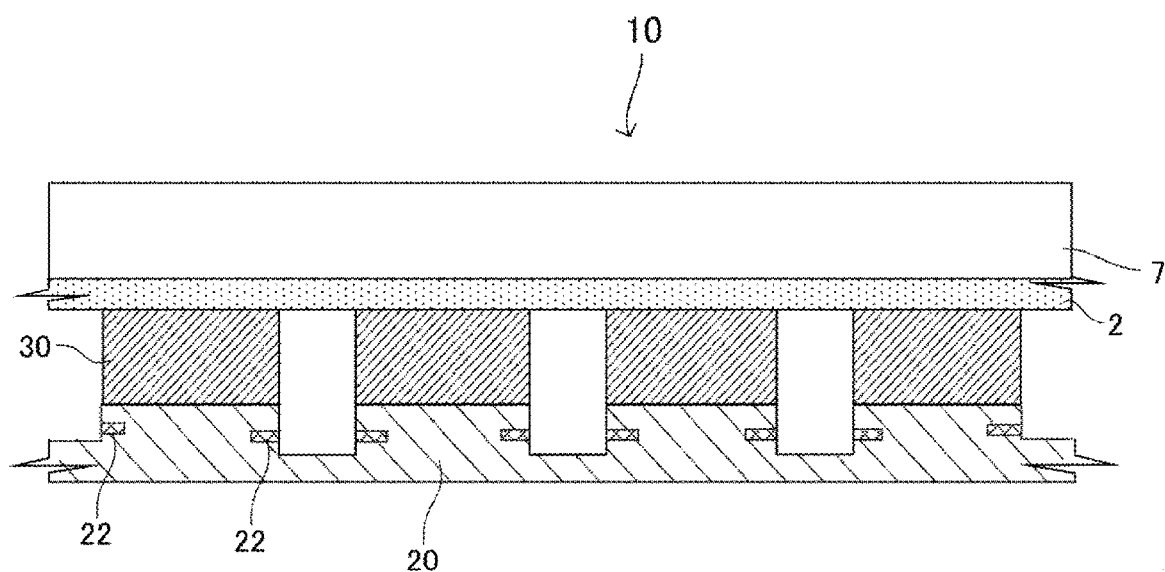
FIG. 8 is a cross-cross-sectional view of an electronic component-mounted substrate in a manufacturing process according to an embodiment.

As shown in FIG. 8, after the step (a), the electromagnetic-wave shielding sheet is disposed on the substrate 20, on which the electronic components 30 have been mounted. The electromagnetic-wave shielding sheet is placed in a bonding region between the substrate 20 and the electronic components 30 so that the electromagnetic-wave shielding sheet is opposed to the conductive layer 2 side. The electromagnetic-wave shielding sheet may be temporarily stuck on the substrate 20 after being placing.

The expression "temporary sticking" means temporarily bonding the electromagnetic-wave shielding sheet to the upper surface of at least a part of an electronic components 30, and means a state in which the conductive layer 2 is fixed to the adherend in a B-stage. A plurality of electromagnetic-wave shielding sheets may be used for respective regions of the substrate 20 or for respective electronic components 30 according to the manufacturing equipment or the size or the like or the substrate 20. However, in order to simplify the manufacturing process, one electromagnetic-wave shielding sheet is preferably used for all of a plurality of electronic components 30 mounted on the substrate 20.

"Step (c)"

A step (c) is a step of obtaining an electromagnetic-wave shielding layer by bonding the conductive layer by hot pressing after the step (b) so that the conductive layer conforms to step parts that are formed due to the mounting of the electronic components and an exposed surface of the substrate.

Figure 9:
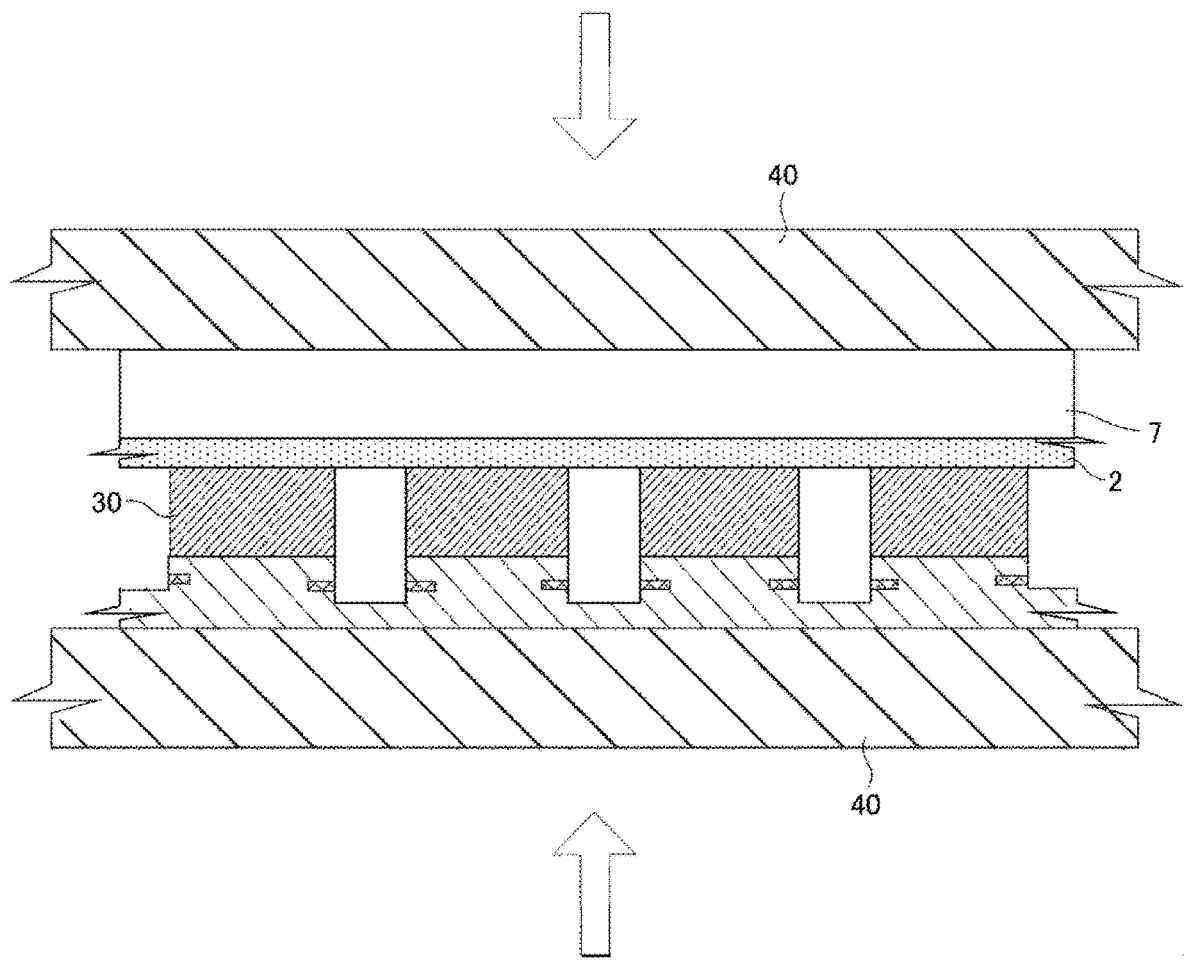
FIG. 9 is a cross-cross-sectional view of an electronic component-mounted substrate in a manufacturing process according to an embodiment.
Figure 10:
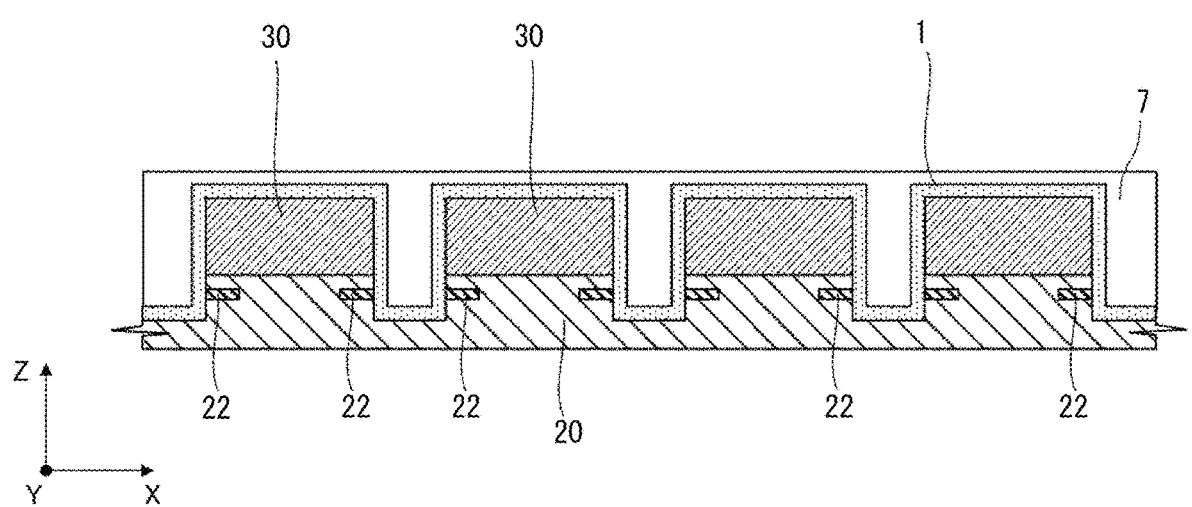
FIG. 10 is a cross-cross-sectional view of an electronic component-mounted substrate in a manufacturing process according to an embodiment.

As shown in FIG. 9, the manufactured substrate obtained by the step (b) is sandwiched between a pair of press substrates 40 and hot-pressed. The conductive layer is stretched (i.e., drawn) along half-dicing grooves 25 formed in the manufactured substrate by pressing caused by the melting of the cushion layer 7, and is applied (i.e., coated) so as to conform to the electronic components 30 and the substrate 20. As a result, an electromagnetic-wave shielding layer 1 is formed. By releasing the press substrates 40, a manufactured substrate is obtained as shown in FIG. 10.

Depending on the durability of the electronic components 30, the manufacturing equipment, or the needs thereof, the pressure in the hot-pressing process can be arbitrarily set within a range in which the covering property of the conductive layer is ensured. The pressure range is not limited to any ranges, but is preferably about 0.5 to 15.0 MPa, more preferably 1 to 13.0 MPa, and still more preferably 2 to 10.0 MPa. Note that, if necessary, a protective layer or the like may be provided on the electromagnetic-wave shielding layer. The difference between the film thickness before the hot pressing and that after the hot pressing is preferably in a range of no smaller than 1% and smaller than 20%, more preferably in a range of no smaller than 2% and smaller than 15%. By making the difference smaller than 20%, the amount of cracking in the electromagnetic-wave shielding layer can be reduced. By making the difference equal to or larger than 1%, the step conforming property becomes excellent.

The time of the hot pressing may be set according to the heat resistance of the electronic components, the binder resin used in the conductive layer, the manufacturing process, and the like. The time of the hot pressing is preferably in a range of about 1 minute to 2 hours. Note that the time of the hot pressing is more preferably about 1 minute to 1 hour. When a thermosetting resin is used as the binder resin, it is preferred that the curing of the thermosetting resin is completed by the aforementioned hot pressing. However, if an uncured part remains, a baking step using an oven or an IR heater may be separately carried out. However, the thermosetting resin may be partially cured prior to the hot pressing provided that the resin is flowable, or the curing may be substantially completed prior to the hot pressing.

As for the hot-pressing apparatus, a pressing-type hot-pressing apparatus, a transfer molding apparatus, a compression molding apparatus, a vacuum and pressure forming apparatus, or the like can be used.

Note that arrows indicating the direction of the pressing shown in FIG. 9 are merely an example, and the direction of the pressing is not limited to the vertical direction.

"Step (d)"

A step (d) is a step of removing the cushion layer after the step (c).

Figure 11:
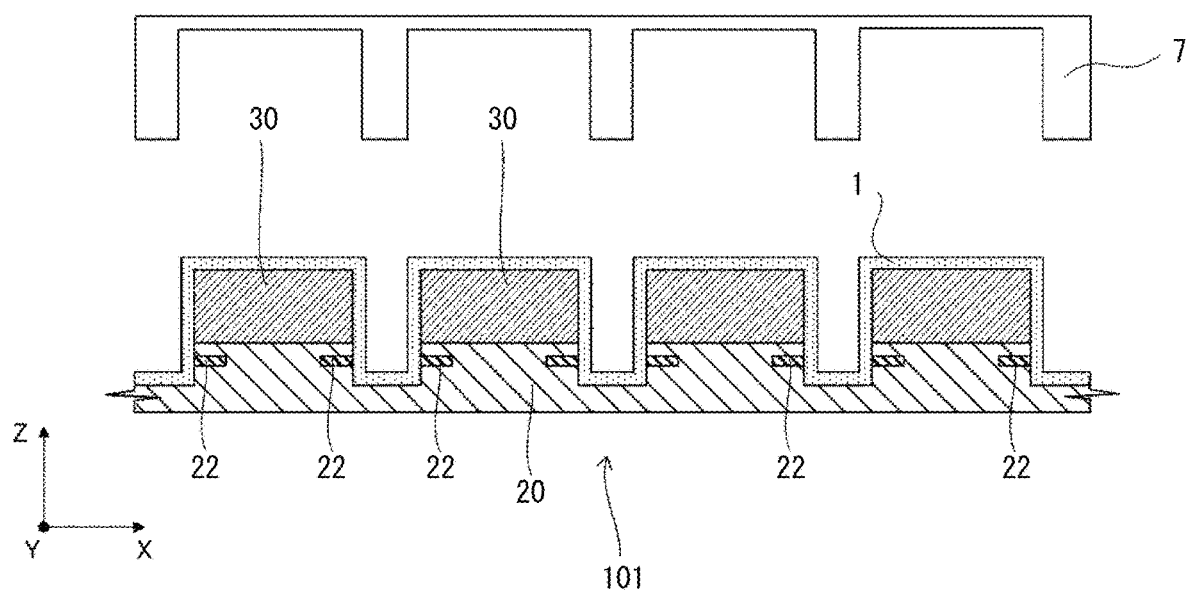
FIG. 11 is a cross-cross-sectional view of an electronic component-mounted substrate in a manufacturing process according to an embodiment.

Next, as shown in FIG. 11, the cushion layer 7 located above the electromagnetic-wave shielding layer 1 is peeled off. As a result, an electronic component-mounted substrate 101 including the electromagnetic-wave shielding layer 1 covering the electronic components 30 is obtained (see FIGS. 1 and 2).

After the step (d), the substrate 20 is diced, by using a dicing blade or the like, from the electromagnetic-wave shielding layer 1 side in the XY-directions in places corresponding to the areas of individual products in the electronic component-mounted substrate 101. As a result, electronic component-mounted substrates in each of which the electronic component 30 is covered with the electromagnetic-wave shielding layer 1 are obtained. Regarding the electromagnetic-wave shielding layer 1, electronic component-mounted substrates in each of which a ground pattern 22 formed in the substrate 20 is electrically connected to the electromagnetic-wave shielding layer are obtained.

Note that the separation into individual pieces by the dicing may be performed from the substrate 20 surface side of the manufactured substrate obtained in the step (c). This method is preferred because burrs of the electromagnetic-wave shielding layer are suppressed and the peeling property of the cushion layer 7 is improved.

According to the manufacturing method in accordance with this embodiment, by forming an electromagnetic-wave shielding layer 1 through the steps (a) to (d) by using an electromagnetic-wave shielding sheet, it is possible to suppress cracking in the edges parts of the electronic components 30 and to manufacture an electronic component-mounted substrate 101 having the electromagnetic-wave shielding layer 1 which is uniformly buried in the grooves and has high reliability for the ground connection. Further, since a plurality of electronic components having projections and depressions can be collectively coated with an electromagnetic-wave shielding layer, the productivity is excellent. Further, since the electromagnetic-wave shielding layer can be formed irrespective of the arrangement, the positions, and the shapes of the components, it is highly versatile. It is also easy to cut the substrate into sections having optimum sizes according to the size of the manufactured substrate. Further, it is possible, by using the electromagnetic-wave shielding sheet according to this embodiment, to provide an electronic component-mounted substrate 101 having an electromagnetic-wave shielding layer 1 having an excellent shape conforming property.

Further, since the electromagnetic-wave shielding sheet is pressure-bonded to the substrate by pressing it toward the surface of the substrate, the electromagnetic-wave shielding layer disposed on the top surfaces of the electronic components has excellent smoothness. Therefore, it is possible to provide a high-quality electronic component-mounted substrate in which when a product name or a lot number is printed thereon by an ink-jet method or a laser marking method, it provides improved visibility of the printed letters. Further, there are advantages that the thickness of the substrate can be easily controlled by controlling the conditions for the hot pressing and the thickness can be easily reduced.

<<Electronic Apparatus>>

An electronic component-mounted substrate according to this embodiment can be mounted on a mounting substrate through, for example, solder balls 24 formed on the under surface of the substrate 20, and can be installed in an electronic apparatus. For example, an electronic component-mounted substrate according to this embodiment can be used in various electronic apparatuses such as a personal computer, a tablet-type terminal, a smartphone, a drone, and the like.

EXAMPLE

Although the present invention will be described hereinafter in a more detailed manner by using examples, the present invention is not limited to the below-described examples. Further, in the examples, the term "parts" means "mass parts" and the term "%" means "mass %", respectively. Further, values mentioned in the present invention were determined by the below-described method.

(1) Manufacturing of Test Substrate

Figure 12:
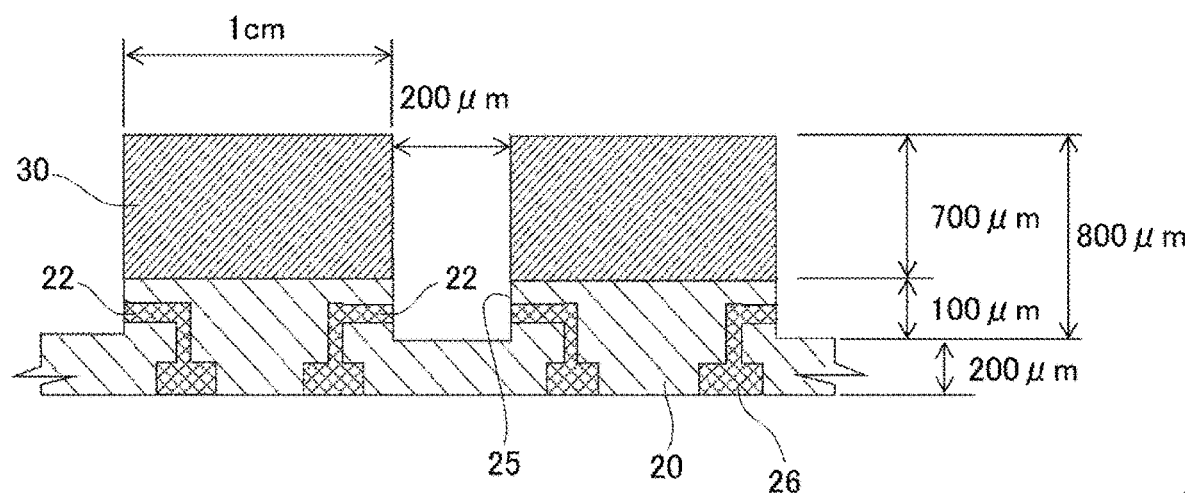
FIG. 12 is a schematic cross-cross-sectional view showing another example of an electronic component-mounted substrate according to an embodiment.

A substrate made of glass epoxy on which electronic components sealed by molding were mounted in an array was prepared. The thickness of the substrate was 0.3 mm, and the thickness of the mold sealing, i.e., the height (the height of the component) H from the upper surface of the substrate to the top surface of the mold sealing material was 0.7 mm. A ground pattern was formed inside the substrate. After that, half-dicing was performed along grooves, which were gaps between components, so that a test substrate was obtained (see FIG. 12). The depth of the half-cut grooves was 0.8 mm (the depth of the cut grooves in the substrate 20 was 0.1 mm), and the width of the half-cut grooves was 200 µm. Because of the half-cutting, the ground pattern disposed inside the substrate was exposed on the side surfaces thereof.

Materials used in the examples are shown hereinafter.

Conductive Filler 1: "Scaly particles made of silver, Average particle diameter $D_{50}$=6.0 µm, Thickness 0.8 µm"

Binder Resin 1: Polyurethane-based resin, Acid value 10 [mgKOH/g] (manufactured by Toyochem Co., Ltd.)

Binder Resin 2: Polycarbonate-based resin, Acid value 5 [mgKOH/g] (manufactured by Toyochem Co., Ltd.)

Curable Compound 1: Epoxy resin, "Denacol EX830" (bifunctional epoxy resin, epoxy equivalent=268 g/eq) manufactured by Nagase ChemteX Corporation Curable Compound 2: Epoxy resin, "YX8000" (hydrogenated bisphenol epoxy resin, epoxy equivalent=210 g/eq) manufactured by Mitsubishi Chemical Corporation Curable Compound 3: Epoxy resin, "jER157S70" (bisphenol A novolak-type epoxy resin, epoxy equivalent=208 g/eq) manufactured by Mitsubishi Chemical Corporation Curing Accelerator: Aziridine compound, "Chemitite PZ-33" (manufactured by Nippon Shokubai Co., Ltd.)

Mold-release Base Material: PET film having a thickness of 50 μm in which the surface is coated with silicone mold-release agent Cushion Layer: Three-layered TPX "CR1040" (manufactured by Mitsui Chemicals Tohcello. Inc.)

<Average Particle Diameter $D_{50}$>

The average particle diameter $D_{50}$ is a numerical value of an average particle diameter $D_{50}$ obtained by measuring a conductive filler, a radio-wave absorbing filler, or an inorganic filler in a tornado dry powder sample module by using a laser diffraction/scattering particle diameter distribution measuring apparatus LS 13320 (manufactured by Beckman Coulter, Inc.), and is a particle diameter at a cumulative value of 50% in a particle diameter cumulative distribution. The distribution was a volume distribution and the refractive index was set to 1.6. The particle diameter may be any type of a particle diameter, and may be that for primary particles or for secondary particles.

<Thickness of Conductive Filler>

Based on an image obtained by enlarging an image of a cut surface in which the thickness of an electromagnetic-wave shielding layer was measured by 1,000 to 50,000 times by an electron microscope, about 10 to 20 different particles were measured and the average value thereof was used.

<Measurement of Thickness>

As for the thickness of the electromagnetic-wave shielding layer, the cross section of the electronic component-mounted substrate was exposed by a grinding method, and the film thickness of the thickest part in the upper-surface region of the electronic component was measured by a laser microscope. Exposed cross sections of five samples of different electronic component-mounted substrates were measured in a similar manner and an average value thereof was used as the thickness.

<Measurement of Conductive Filler Occupation Area Ratios (A) and (B)>

Descriptions will be given with reference to FIG. 15. Firstly, a cut surface of an electromagnetic-wave shielding sheet in the thickness direction was formed by cutting the electromagnetic-wave shielding sheet by the emission of an ion beam by using a cross section polisher (SM-09010 manufactured by JEOL Ltd.). Next, platinum was vapor-deposited on a cross section of the obtained electromagnetic-wave shielding sheet, and an enlarged image shown in FIG. 15 was observed by using a field emission electron microscope (S-4700 manufactured by Hitachi, Ltd.). The conditions for the observation were as follows: an acceleration voltage was 5 kV; an emission current was 8 mA; and a magnification was 1,300 times.

Data of the obtained enlarged image was read by using free software "GIMP2.8.18", and as shown in FIG. 15, a threshold value was automatically adjusted so that the conductive filler was converted into white and the components other than the conductive filler was converted into black. After that, a region from the side of the conductive layer opposite to the cushion layer side thereof to 30% of the thickness was designated as a range, and a white region (0 to 254) in a histogram was selected. By doing so, the percentage of the number of white pixels, i.e., the ratio of the area occupied by the component of the conductive filler was obtained while defining the cross-sectional area of the region up to 30% of the thickness of the conductive layer as 100%. Then, the conductive filler occupation area ratio (A) was obtained by evaluating five different samples and calculating an average value thereof. The conductive filler occupation area ratio (B) was also measured by a method similar to that for the conductive filler occupation area ratio (A), except that the cross-sectional range of the conductive layer on the cushion layer side was selected.

<Measurement of Acid Value>

About 1 g of a thermosetting resin was precisely measured and put into an Erlenmeyer flask with a stopper, and dissolved in 50 mL of a toluene/ethanol mixture (volume ratio: toluene/ethanol=2/1) which was also added in the flask. A phenolphthalein test solution was added as an indicator in this solution, and the mixture was kept undisturbed for 30 seconds. After that, the solution was titrated with a 0.1 mol/L alcoholic potassium hydroxide solution until the solution had a pale red color. The acid value was obtained by the below-shown expression. The acid value is a value in a dried state of the resin.

$$\text{Acid value (mgKOH/g)}=(a \times F \times 56.1 \times 0.1)/S$$

S: Amount of collected sample×(Solid content of sample/100) (g)

a: Amount of 0.1 mol/L alcoholic potassium hydroxide solution (mL) determined by titration (mL)

F: Titer of 0.1 mol/L alcoholic potassium hydroxide solution

<Measurement of Weight-Average Molecular Weight (Mw)>

The weight average molecular weight (Mw) was measured by using GPC (gel permeation chromatography) "HPC-8020" manufactured by Tosoh Corporation. The GPC is liquid chromatography in which substances dissolved in a solvent (THF; tetrahydrofuran) are separated based on differences in their molecular sizes and their amounts are determined. The measurement was carried out by using two columns "LF-604" (GPC column for quick analysis manufactured by Showa Denko K. K.: 6 mm ID×150 mm size) connected in series under the conditions of a flow rate of 0.6 mL/min and a column temperature of 40° C., and a polystyrene-equivalent weight-average molecular weights (Mw) was determined.

<Measurement of Peel Strength>

The obtained electromagnetic-wave shielding sheets was processed into a size of a width of 25 mm and a length of 70 mm, and used as samples. The mold-release base material of the conductive layer was peeled off from the sample, and a pressure-sensitive adhesive tape (25 μm of a PET film coated with 25 μm of acrylic pressure-sensitive adhesive ("LE301-25K" manufactured by Toyochem Co., Ltd.)) was stuck on the conductive layer. Next, the peel strength of this laminate was measured by peeling the conductive layer and the pressure-sensitive adhesive tape from the cushion layer under conditions of an atmosphere of 23° C. and 50% RH, a peeling speed of 50 mm/min, and a peeling angle of 180° by using a tensile test machine (manufactured by Shimadzu Corporation).

Example 1

A conductive resin composition was obtained by putting 50 parts of a binder resin 1 (solid content), 50 parts of a binder resin 2 (solid content), 10 parts of a curable compound 1, 20 parts of a curable compound 2, 10 parts of a curable compound 3, 1 part of a curing accelerator, and 149 parts of a conductive filler 1 into a vessel, adding a mixed solvent of toluene and isopropyl alcohol (mass ratio 2:1) so that the concentration of the nonvolatile content becomes 45 mass %, and stirring the mixture for 10 minutes by using a disperser. This conductive resin composition was applied to a mold-release base material by using a doctor blade so that a dried thickness thereof becomes 25 μm. Then, by drying the conductive resin composition at 100° C. for two minutes, a sheet B in which the mold-release base material and a conductive layer 4 (a conductive layer b) were laminated was obtained.

Separately, a conductive resin composition was obtained by putting 50 parts of a binder resin 1 (solid content), 50 parts of a binder resin 2 (solid content), 10 parts of a curable compound 1, 20 parts of a curable compound 2, 10 parts of a curable compound 3, 1 part of a curing accelerator, and 376 parts of a conductive filler 1 into a vessel, adding a mixed solvent of toluene and isopropyl alcohol (mass ratio 2:1) so that the concentration of the nonvolatile content becomes 45 mass %, and stirring the mixture for 10 minutes by using a disperser. This conductive resin composition was applied to a mold-release base material by using a doctor blade so that a dried thickness thereof becomes 25 μm. Then, by drying the conductive resin composition at 100° C. for two minutes, a sheet A in which the mold-release base material and a conductive layer 5 (a conductive layer a) were laminated was obtained.

The conductive layers 4 and 5 of the sheets B and A were bonded to each other by using a hot-roll laminator. Next, the mold-release base material of the sheet B was peeled off, and the sheet B was bonded to one of the surfaces of the cushion layer by a hot-roll laminator, so that an electromagnetic-wave shielding sheet in which the cushion layer, the conductive layer 4, the conductive layer 5, and the mold-release base material were laminated in this order was obtained. The conditions for the bonding were 70° C. and 3 kgf/cm².

The obtained electromagnetic-wave shielding sheet was cut into a size of 10 cm×10 cm, and the mold-release base material was peeled off. Further, the conductive layer 5 was placed on the above-described test substrate. After that, the substrate surface was hot-pressed from the top of the cushion layer of the electromagnetic-wave shielding sheet for 20 minutes under conditions of 5 MPa and 160° C. After the hot-pressing, the laminate was cooled and the cushion layer was peeled off, so that an electronic component-mounted substrate including an electromagnetic-wave shielding layer formed therein was obtained.

Examples 2 to 22 and Comparative Examples 1 to 3

Electronic component-mounted substrates were manufactured in a manner similar to that for the Example 1, except that the thickness and the physical properties of each layer, the components and their blending amounts (mass parts), and the groove width and groove depth of the electronic components of the test substrates were changed as shown in Table 1 to 3. The blending amounts of the binder resins and the curable compounds shown in Table 1 to 3 are expressed in masses of solid contents.

Example 23

An electromagnetic-wave shielding sheet was manufactured in a manner similar to that for the Example 1, except that the conditions for bonding the sheets B and A were changed to 90° C. and 3 kgf/cm² in vacuum, and an electronic component-mounted substrate was obtained.

The above-described examples and the comparative Examples were evaluated by the below-described measurement methods and evaluation criteria.

<Evaluation of Cushion Stickability>

The obtained electromagnetic-wave shielding sheets were cut into a size of a width of 10 mm and a length of 10 mm, and used as samples. After 20 samples were placed in a mayonnaise bin of 90 mL (a cylindrical glass bottle with a cap, having a diameter of 45 mm and a height of 80 mm), the bin was capped. Then, mayonnaise bin was placed in a paint conditioner and the content thereof was stirred for 30 minutes. After that, the stickability of the cushion layer was evaluated by visually checking delamination between the cushion layer and the conductive layer of the sample.

+++: There was no delamination in any sample. It was a very good result.

++: There is no delamination in any sample, but un-stuck parts appeared at the end parts. It was a good result.

+: The number of samples in which peeling occurred was less than five. It was practically acceptable.

NG: The number of samples in which peeling occurred was five or more. It could not be practically used.

<Evaluation of Shielding Property>

The obtained electromagnetic-wave shielding sheets was processed into a size of a length of 50 mm and a width of 50 mm, and used as samples. The samples were subjected to hot pressure-bonding for 30 minutes under conditions of 150° C. and 2 MPa, and subjected to the main curing process. Next, the peelable sheet of the conductive layer was peeled off, and the surface resistance value of the conductive layer was measured by using a four-probe-type probe "Lorester GP" manufactured by Mitsubishi Chemical Analitech Co., Ltd. The evaluation criteria were as follows.

+++: Lower than 0.2 [Ω/□]. It was a very good result.

++: No lower than 0.2 [Ω/□] and lower than 0.6 [Ω/□]. It was a good result.

+: No lower than 0.6 [Ω/□] and lower than 1.2 [Ω/□]. It was practically acceptable.

NG: No lower than 1.2 [Ω/□]. It could not be practically used.

<Evaluation of Ground Connectivity>

Figure 13:
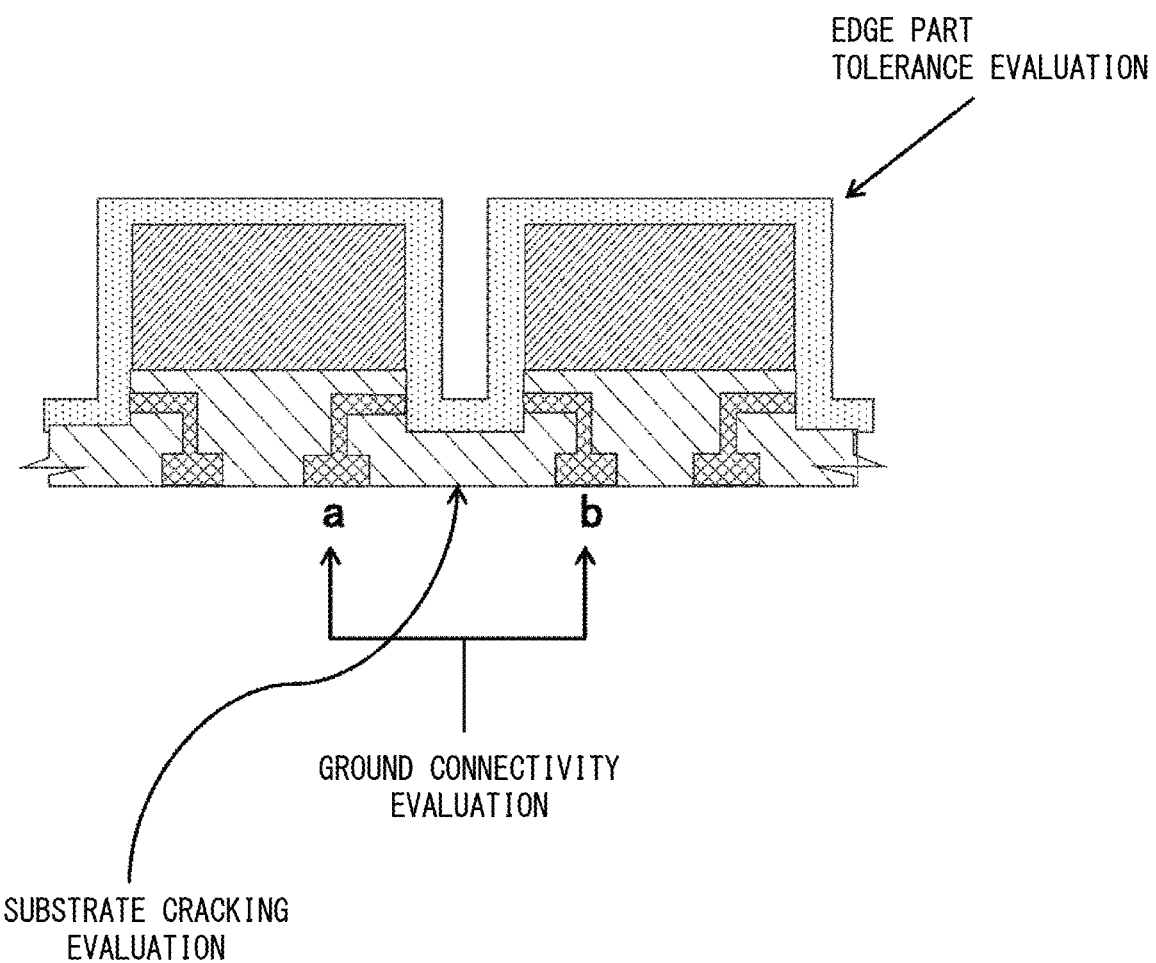
FIG. 13 is a schematic cross-cross-sectional view showing a method for evaluating an electronic component-mounted substrate according to an embodiment.
Figure 14:
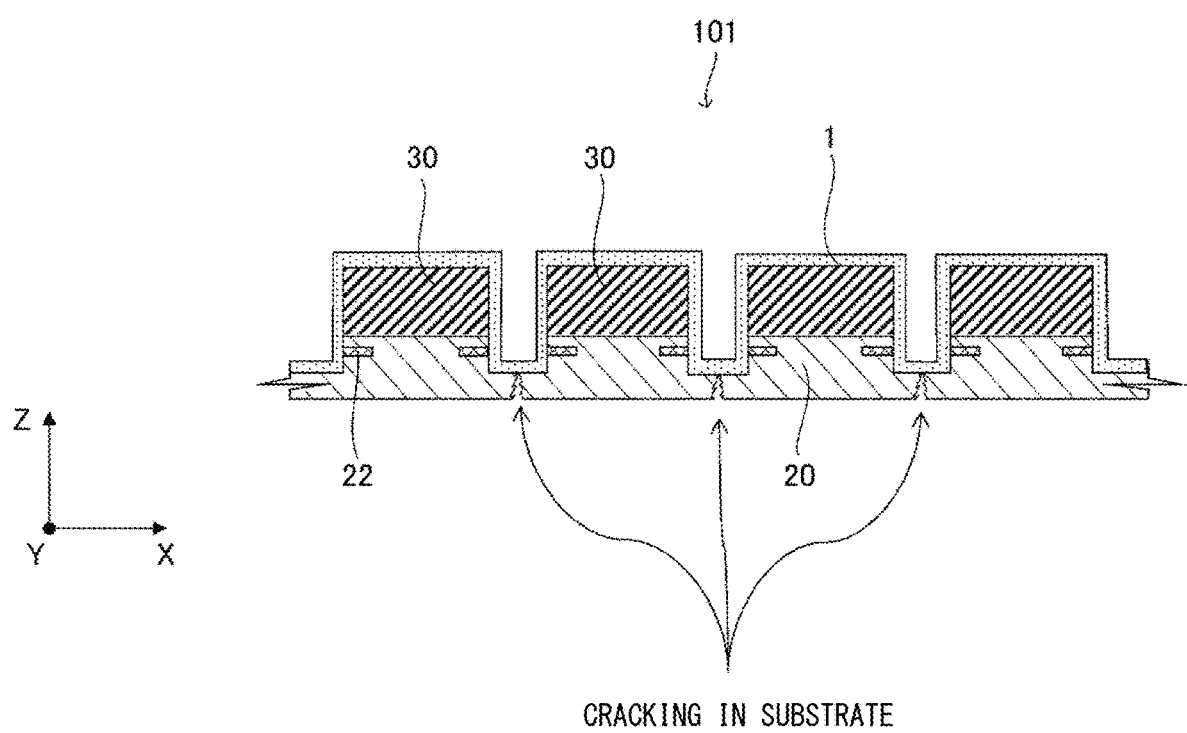
FIG. 14 shows an example of cracking in a substrate.

The ground connectivity of the obtained component-mounted substrate was evaluated by measuring the connection resistance value between ground terminals a and b at the bottom shown in the cross-sectional view shown in FIG. 13 by using RM3544 manufactured by HIOKI E.E. Corporation and a pin-type lead probe. In other words, it was checked whether the electromagnetic-wave shielding layer was connected to the ground pattern exposed on the side surface, i.e., connected to the ground. The evaluation criteria were as follows.

+++: Connection resistance value was lower than 200 mΩ. It was a very good result.

++: Connection resistance value was no lower than 200 mΩ and lower than 500 mΩ. It was a good result.

+: Connection resistance value was no lower than 500 mΩ and lower than 1,000 mΩ. It was practically acceptable.

NG: Connection resistance value was not lower than 1,000 mΩ. It could not be practically used.

<Evaluation of Substrate Cracking>

Parts corresponding to the underside of grooves of the electronic component-mounted substrate shown in FIG. 13 were observed and evaluated as to occurrence of cracking by a laser microscope. In the observation, 20 different grooves were evaluated. The evaluation criteria were as follows.

+++: No cracking. It was a very good result.

++: The number of cracks was smaller than 5. It was a good result.

+: The number of cracks was no smaller than 5 and smaller than 10. It was practically acceptable.

NG: The number of cracks was not smaller than 10. It could not be practically used.

Tables 1 to 3 show the results of the evaluations of the electronic component-mounted substrates and the electromagnetic-wave shielding sheets according to the examples and the comparative examples.

TABLE 1

|  |  | Example |  |  |  |  |  |  |  |  |
|---|---|---|---|---|---|---|---|---|---|---|
|  |  | 1 | 2 | 3 | 4 | 5 | 6 | 7 | 8 | 9 |
| Conductive Layer b (cushion layer side) | Binder Resin 1 (polyurethane resin) | 50 | 50 | 50 | 50 | 50 | 50 | 50 | 50 | 50 |
|  | Binder Resin 2 (polycarbonate resin) | 50 | 50 | 50 | 50 | 50 | 50 | 50 | 50 | 50 |
|  | Curable compound 1 (Denacol EX830) | 10 | 10 | 10 | 10 | 10 | 10 | 10 | 10 | 10 |
|  | Curable Compound 2 (jERYX8000) | 20 | 20 | 20 | 20 | 20 | 20 | 20 | 20 | 20 |
|  | Curable Compound 3 (jER157S70) | 10 | 10 | 10 | 10 | 10 | 10 | 10 | 10 | 10 |
|  | Curing Accelerator (PZ-33) | 1 | 1 | 1 | 1 | 1 | 1 | 1 | 1 | 1 |
|  | Conductive Filler 1 (flaky Ag) | 149 | 158 | 177 | 245 | 264 | 284 | 201 | 201 | 201 |
|  | Conductive filler in solid content [% mass] | 51% | 53% | 56% | 63% | 65% | 67% | 59% | 59% | 59% |
|  | Thickness [µm] | 25 | 25 | 25 | 25 | 25 | 25 | 25 | 25 | 25 |
| Conductive Layer a (side opposite to the cushion layer) | Binder Resin 1 (polyurethane resin) | 50 | 50 | 50 | 50 | 50 | 50 | 50 | 50 | 50 |
|  | Binder Resin 2 (polycarbonate resin) | 50 | 50 | 50 | 50 | 50 | 50 | 50 | 50 | 50 |
|  | Curable confound 1 (Denacol EX830) | 10 | 10 | 10 | 10 | 10 | 10 | 10 | 10 | 10 |
|  | Curable Compound 2 (jERYX8000) | 20 | 20 | 20 | 20 | 20 | 20 | 20 | 20 | 20 |
|  | Curable Compound 3 (jER157S70) | 10 | 10 | 10 | 10 | 10 | 10 | 10 | 10 | 10 |
|  | Curing accelerator (PZ-33) | 1 | 1 | 1 | 1 | 1 | 1 | 1 | 1 | 1 |
|  | Conductive Filler 1 (flaky Ag) | 376 | 376 | 376 | 376 | 376 | 376 | 219 | 240 | 256 |
|  | Conductive filler in solid content [% mass] | 73% | 73% | 73% | 73% | 73% | 73% | 61% | 63% | 65% |
|  | Thickness [µm] | 25 | 25 | 25 | 25 | 25 | 25 | 25 | 25 | 25 |
| Film Physical Properties | Conductive Filler Occupation Area Ratio (B) [%] | 16.0 | 18.0 | 22.1 | 33.5 | 36.0 | 38.4 | 26.7 | 26.7 | 26.7 |
|  | Conductive Filler Occupation Area Ratio (A) [%] | 46.9 | 46.9 | 46.9 | 46.9 | 46.9 | 46.9 | 29.7 | 32.8 | 35.0 |
|  | Expression (1) = (A) − (B) [%] | 31 | 29 | 25 | 13 | 11 | 9 | 3 | 6 | 8 |
|  | Thickness of Conductive Layer [µm] | 50 | 50 | 50 | 50 | 50 | 50 | 50 | 50 | 50 |
|  | Peel Strength [N/25 mm] | 2.9 | 2.8 | 2.3 | 1.5 | 0.9 | 0.8 | 1.8 | 1.8 | 1.8 |
|  | Presence of Holes | Present | Present | Present | Present | Present | Present | Present | Present | Present |
| Adherend | Groove Width [µm] | 200 | 200 | 200 | 200 | 200 | 200 | 200 | 200 | 200 |
|  | Groove Depth [µm] | 800 | 800 | 800 | 800 | 800 | 800 | 800 | 800 | 800 |
|  | Groove Depth/Groove Width | 4 | 4 | 4 | 4 | 4 | 4 | 4 | 4 | 4 |
| Evaluation of Performance | Cushion Adhesiveness | +++ | +++ | +++ | +++ | ++ | + | +++ | +++ | +++ |
|  | Shielding Property | + | ++ | +++ | +++ | +++ | +++ | + | ++ | +++ |
|  | Ground Connectivity | +++ | +++ | +++ | +++ | +++ | +++ | + | ++ | +++ |
|  | Substrate Cracking | + | ++ | +++ | +++ | +++ | +++ | +++ | +++ | +++ |

TABLE 2

|  |  | Example |  |  |  |  |  |  |  |  |
|---|---|---|---|---|---|---|---|---|---|---|
|  |  | 10 | 11 | 12 | 13 | 14 | 15 | 16 | 17 | 18 |
| Conductive Layer b (cushion layer side) | Binder Resin 1 (polyurethane resin) | 50 | 50 | 50 | 50 | 50 | 50 | 50 | 50 | 50 |
|  | Binder Resin 2 (polycarbonate resin) | 50 | 50 | 50 | 50 | 50 | 50 | 50 | 50 | 50 |

TABLE 2-continued

|  |  | Example | | | | | | | | |
|---|---|---|---|---|---|---|---|---|---|---|
|  |  | 10 | 11 | 12 | 13 | 14 | 15 | 16 | 17 | 18 |
| Conductive Layer a (side opposite to the cushion layer) | Curable compound 1 (Denacol EX830) | 10 | 10 | 10 | 10 | 10 | 10 | 10 | 10 | 10 |
|  | Curable Compound 2 (jERYX8000) | 20 | 20 | 20 | 20 | 20 | 20 | 20 | 20 | 20 |
|  | Curable Compound 3 (jER157S70) | 10 | 10 | 10 | 10 | 10 | 10 | 10 | 10 | 10 |
|  | Curing Accelerator (PZ-33) | 1 | 1 | 1 | 1 | 1 | 1 | 1 | 1 | 1 |
|  | Conductive Filler 1 (flaky Ag) | 201 | 201 | 201 | 242 | 242 | 242 | 242 | 242 | 242 |
|  | Conductive filler in solid content [% mass] | 59% | 59% | 59% | 63% | 63% | 63% | 63% | 63% | 63% |
|  | Thickness [μm] | 25 | 25 | 25 | 4 | 7 | 10 | 30 | 32 | 34 |
|  | Binder Resin 1 (polyurethane resin) | 50 | 50 | 50 | 50 | 50 | 50 | 50 | 50 | 50 |
|  | Binder Resin 2 (polycarbonate resin) | 50 | 50 | 50 | 50 | 50 | 50 | 50 | 50 | 50 |
|  | Curable compound 1 (Denacol EX830) | 10 | 10 | 10 | 10 | 10 | 10 | 10 | 10 | 10 |
|  | Curable Compound 2 (jERYX8000) | 20 | 20 | 20 | 20 | 20 | 20 | 20 | 20 | 20 |
|  | Curable Compound 3 (jER157S70) | 10 | 10 | 10 | 10 | 10 | 10 | 10 | 10 | 10 |
|  | Curing accelerator (PZ-33) | 1 | 1 | 1 | 1 | 1 | 1 | 1 | 1 | 1 |
|  | Conductive Filler 1 (flaky Ag) | 382 | 445 | 493 | 376 | 376 | 376 | 376 | 376 | 376 |
|  | Conductive filler in solid content [% mass] | 73% | 76% | 78% | 73% | 73% | 73% | 73% | 73% | 73% |
|  | Thickness [μm] | 25 | 25 | 25 | 4 | 8 | 10 | 30 | 33 | 34 |
| Film Physical Properties | Conductive Filler Occupation Area Ratio (B) [%] | 26.7 | 26.7 | 26.7 | 33.1 | 33.1 | 33.1 | 33.1 | 33.1 | 33.1 |
|  | Conductive Filler Occupation Area Ratio (A) [%] | 47.4 | 51.6 | 54.3 | 46.9 | 46.9 | 46.9 | 46.9 | 46.9 | 46.9 |
|  | Expression (1) = (A) − (B) [%] | 21 | 25 | 28 | 14 | 14 | 14 | 14 | 14 | 14 |
|  | Thickness of Conductive Layer [μm] | 50 | 50 | 50 | 8 | 15 | 20 | 60 | 65 | 68 |
|  | Peel Strength [N/25 mm] | 1.8 | 1.8 | 1.8 | 1.5 | 1.5 | 1.5 | 1.5 | 1.5 | 1.5 |
| Adherend | Presence of Holes | Present | Present | Present | Present | Present | Present | Present | Present | Present |
|  | Groove Width [μm] | 200 | 200 | 200 | 200 | 200 | 200 | 200 | 200 | 200 |
|  | Groove Depth [μm] | 800 | 800 | 800 | 800 | 800 | 800 | 800 | 800 | 800 |
|  | Groove Depth/Groove Width | 4 | 4 | 4 | 4 | 4 | 4 | 4 | 4 | 4 |
| Evaluation of Performance | Cushion Adhesiveness | +++ | +++ | +++ | + | +++ | +++ | +++ | +++ | +++ |
|  | Shielding Property | +++ | +++ | +++ | + | ++ | +++ | +++ | +++ | +++ |
|  | Ground Connectivity | +++ | ++ | + | + | ++ | +++ | +++ | +++ | +++ |
|  | Substrate Cracking | +++ | +++ | +++ | +++ | +++ | +++ | +++ | ++ | + |

TABLE 3

|  |  | Example | | | | | Comparative Example | | |
|---|---|---|---|---|---|---|---|---|---|
|  |  | 19 | 20 | 21 | 22 | 23 | 1 | 2 | 3 |
| Conductive Layer b (cushion layer side) | Binder Resin 1 (polyurethane resin) | 50 | 50 | 50 | 50 | 50 | 50 | 50 | 50 |
|  | Binder Resin 2 (polycarbonate resin) | 50 | 50 | 50 | 50 | 50 | 50 | 50 | 50 |
|  | Curable compound 1 (Denacol EX830) | 10 | 10 | 10 | 10 | 10 | 10 | 10 | 10 |
|  | Curable Compound 2 (jERYX8000) | 20 | 20 | 20 | 20 | 20 | 20 | 20 | 20 |
|  | Curable Compound 3 (jER157S70) | 10 | 10 | 10 | 10 | 10 | 10 | 10 | 10 |
|  | Curing Accelerator (PZ-33) | 1 | 1 | 1 | 1 | 1 | 1 | 1 | 1 |
|  | Conductive Filler 1 (flaky Ag) | 242 | 242 | 242 | 242 | 201 | 201 | 242 | 242 |
|  | Conductive filler in solid | 63% | 63% | 63% | 63% | 59% | 59% | 63% | 63% |

TABLE 3-continued

|  |  | Example | | | | | Comparative Example | | |
|---|---|---|---|---|---|---|---|---|---|
|  |  | 19 | 20 | 21 | 22 | 23 | 1 | 2 | 3 |
| Conductive Layer a (side opposite to the cushion layer) | content [% mass] | | | | | | | | |
|  | Thickness [μm] | 25 | 25 | 25 | 25 | 25 | 25 | 3 | 36 |
|  | Binder Resin 1 (polyurethane resin) | 50 | 50 | 50 | 50 | 50 | 50 | 50 | 50 |
|  | Binder Resin 2 (polycarbonate resin) | 50 | 50 | 50 | 50 | 50 | 50 | 50 | 50 |
|  | Curable compound 1 (Denacol EX830) | 10 | 10 | 10 | 10 | 10 | 10 | 10 | 10 |
|  | Curable Compound 2 (jERYX8000) | 20 | 20 | 20 | 20 | 20 | 20 | 20 | 20 |
|  | Curable Compound 3 (jER157S70) | 10 | 10 | 10 | 10 | 10 | 10 | 10 | 10 |
|  | Curing accelerator (PZ-33) | 1 | 1 | 1 | 1 | 1 | 1 | 1 | 1 |
|  | Conductive Filler 1 (flaky Ag) | 376 | 376 | 376 | 376 | 240 | 186 | 376 | 376 |
|  | Conductive filler in solid content [% mass] | 73% | 73% | 73% | 73% | 63% | 57% | 73% | 73% |
|  | Thickness [μm] | 25 | 25 | 25 | 25 | 25 | 25 | 3 | 36 |
| Film Physical Properties | Conductive Filler Occupation Area Ratio (B) [%] | 33.1 | 33.1 | 33.1 | 33.1 | 26.7 | 26.7 | 33.1 | 33.1 |
|  | Conductive Filler Occupation Area Ratio (A) [%] | 46.9 | 46.9 | 46.9 | 46.9 | 32.8 | 24.0 | 46.9 | 46.9 |
|  | Expression (1) = (A) − (B) [%] | 14 | 14 | 14 | 14 | 6 | 3 | 14 | 14 |
|  | Thickness of Conductive Layer [μm] | 50 | 50 | 50 | 50 | 50 | 50 | 6 | 72 |
|  | Peel Strength [N/25 mm] | 1.5 | 1.5 | 1.5 | 1.5 | 1.8 | 1.8 | 1.5 | 1.5 |
|  | Presence of Holes | Present | Present | Present | Present | Present | Present | Present | Present |
| Adherend | Groove Width [μm] | 200 | 175 | 150 | 300 | 200 | 200 | 200 | 200 |
|  | Groove Depth [μm] | 1000 | 1000 | 1000 | 400 | 800 | 800 | 800 | 800 |
|  | Groove Depth/Groove Width | 5 | 6 | 7 | 1 | 4 | 4 | 4 | 4 |
| Evaluation of Performance | Cushion Adhesiveness | +++ | +++ | +++ | +++ | +++ | +++ | + | +++ |
|  | Shielding Property | +++ | +++ | +++ | +++ | ++ | NG | NG | +++ |
|  | Ground Connectivity | ++ | ++ | + | +++ | + | NG | NG | +++ |
|  | Substrate Cracking | +++ | +++ | +++ | +++ | +++ | +++ | +++ | NG |

This application is based upon and claims the benefit of priority from Japanese patent application No. 2018-188338, filed on Oct. 3, 2018, the disclosure of which is incorporated herein in its entirety by reference.

The invention claimed is:

1. An electromagnetic-wave shielding sheet used to form an electromagnetic-wave shielding layer constituting a part of an electronic component-mounted substrate,
the electronic component-mounted substrate comprising:
a substrate;
an electronic component mounted on at least one surface of the substrate; and
the electromagnetic-wave shielding layer covering at least a part of a step part formed due to mounting of the electronic component and an exposed surface of the substrate, wherein
the electromagnetic-wave shielding sheet is a laminate including a cushion layer and a conductive layer,
the conductive layer is an isotropic conductive layer containing a binder resin and a conductive filler,
a thickness of the conductive layer is 8 to 70 μm, and
a content of the conductive filler in a region on a side opposite to a cushion layer side in the conductive layer is larger than the content of the conductive filler in a region on the cushion layer side in the conductive layer.

2. The electromagnetic-wave shielding sheet according to claim 1, wherein the conductive layer is a laminate of at least two isotropic conductive layers containing different amounts of the conductive filler.

3. The electromagnetic-wave shielding sheet according to claim 1, wherein,
in the conductive layer, on a cross section thereof in a thickness direction,
a conductive filler occupation area ratio (A) in a region from a side opposite to a cushion layer side to 30% of the thickness is 25 to 55%,
a conductive filler occupation area ratio (B) in a region from the cushion layer side to 30% of the thickness is 15 to 40%, and
the conductive filler occupation area ratio (A) is higher than the conductive filler occupation area ratio (B).

4. The electromagnetic-wave shielding sheet according to claim 3, wherein a difference of the conductive filler occupation area ratio between the conductive filler occupation area ratios (A) and (B) expressed by: Conductive Filler Occupation Area Ratio Difference (%)=Conductive Filler Occupation Area Ratio (A)−Conductive Filler Occupation Area Ratio (B) (Expression (1)) is 1 to 31%.

5. The electromagnetic-wave shielding sheet according to claim 1, wherein the conductive layer includes holes.

6. An electronic component-mounted substrate, comprising:
a substrate;
an electronic component mounted on at least one surface of the substrate; and
an electromagnetic-wave shielding layer formed by an electromagnetic-wave shielding sheet according to claim 1, wherein the electromagnetic-wave shielding layer covers at least a part of a step part formed due to mounting of the electronic component and an exposed surface of the substrate.

* * * * *